US010727810B2

(12) United States Patent
Nosaka

(10) Patent No.: US 10,727,810 B2
(45) Date of Patent: Jul. 28, 2020

(54) RADIO-FREQUENCY FILTER, MULTIPLEXER, RADIO-FREQUENCY FRONT-END CIRCUIT, AND COMMUNICATION DEVICE

(71) Applicant: Murata Manufacturing Co., Ltd., Kyoto (JP)

(72) Inventor: Koji Nosaka, Kyoto (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 0 days.

(21) Appl. No.: 16/553,315

(22) Filed: Aug. 28, 2019

(65) Prior Publication Data
US 2019/0393861 A1    Dec. 26, 2019

Related U.S. Application Data

(63) Continuation of application No. PCT/JP2017/040180, filed on Nov. 8, 2017.

(30) Foreign Application Priority Data

Mar. 1, 2017    (JP) .................................. 2017-038830

(51) Int. Cl.
*H03H 9/64*     (2006.01)
*H03H 9/02*     (2006.01)
(Continued)

(52) U.S. Cl.
CPC ...... *H03H 9/6403* (2013.01); *H03H 9/02818* (2013.01); *H03H 9/14538* (2013.01);
(Continued)

(58) Field of Classification Search
CPC .... H03H 9/6403; H03H 9/02818; H03H 9/72; H03H 9/6483; H03H 9/14544; H03H 9/14538; H04B 1/44
(Continued)

(56) References Cited

U.S. PATENT DOCUMENTS 6,472,953 B1    10/2002   Sakuragawa et al.
2009/0201104 A1    8/2009   Ueda et al.
(Continued)

FOREIGN PATENT DOCUMENTS

JP    2000-114873 A    4/2000
JP    2000-323961 A    11/2000
(Continued)

OTHER PUBLICATIONS

International Search Report for International Application No. PCT/JP2017/040180 dated Jan. 30, 2018.
(Continued)

*Primary Examiner* — Eugene Yun
(74) *Attorney, Agent, or Firm* — Pearne & Gordon LLP

(57) ABSTRACT

A filter (10) includes a series arm circuit (11) and a parallel arm circuit (12). The parallel arm circuit (12) includes a parallel arm resonator (p1), a variable frequency circuit (12T), and a parallel arm resonator (p2) connected in parallel with a circuit in which the parallel arm resonator (p1) and the variable frequency circuit (12T) are connected in series. The variable frequency circuit (12T) includes a parallel arm resonator (p3) and a switch (SW) connected in parallel with the parallel arm resonator (p3), and is configured to change frequencies of a pass band and a frequency of an attenuation pole by switching between an on state and off state of the switch (SW). A resonant frequency and anti-resonant frequency of the parallel arm resonator (p1) are respectively different from a resonant frequency and anti-resonant frequency of the parallel arm resonator (p2).

15 Claims, 25 Drawing Sheets

(51) Int. Cl.
*H03H 9/145* (2006.01)
*H03H 9/72* (2006.01)
*H04B 1/44* (2006.01)

(52) U.S. Cl.
CPC ...... *H03H 9/14544* (2013.01); *H03H 9/6483* (2013.01); *H03H 9/72* (2013.01); *H04B 1/44* (2013.01)

(58) Field of Classification Search
USPC .......................................................... 455/83
See application file for complete search history.

(56) References Cited

U.S. PATENT DOCUMENTS

| | | |
|---|---|---|
| 2009/0251235 A1 | 10/2009 | Belot et al. |
| 2010/0110940 A1 | 5/2010 | Hara et al. |
| 2011/0199168 A1 | 8/2011 | Kadota |
| 2012/0187799 A1 | 7/2012 | Nakahashi |
| 2016/0344370 A1 | 11/2016 | Tani et al. |
| 2017/0012651 A1 | 1/2017 | Ellä et al. |
| 2019/0081613 A1* | 3/2019 | Nosaka .................. H03H 7/075 |

FOREIGN PATENT DOCUMENTS

| | | |
|---|---|---|
| JP | 2003-60479 A | 2/2003 |
| JP | 2004-72549 A | 3/2004 |
| JP | 2008-219748 A | 9/2008 |
| JP | 2009-207116 A | 9/2009 |
| JP | 2011-146768 A | 7/2011 |
| JP | 2013-066250 A | 4/2013 |
| JP | 5441095 B2 | 3/2014 |
| WO | 2009/025055 A1 | 2/2009 |
| WO | 2011/049060 A1 | 4/2011 |
| WO | 2015/119178 A1 | 8/2015 |
| WO | 2015/128005 A1 | 9/2015 |

OTHER PUBLICATIONS

Written Opinion for International Application No. PCT/JP2017/040180 dated Jan. 30, 2018.

* cited by examiner frp1≠frp2
fap1≠fap2
frp1<frp3
frp2<frp3 frp1<frp3
frp2<frp3
frp1<frp4
frp2<frp4

RADIO-FREQUENCY FILTER, MULTIPLEXER, RADIO-FREQUENCY FRONT-END CIRCUIT, AND COMMUNICATION DEVICE

This is a continuation of International Application No. PCT/JP2017/040180 filed on Nov. 8, 2017 which claims priority from Japanese Patent Application No. 2017-038830 filed on Mar. 1, 2017. The contents of these applications are incorporated herein by reference in their entireties.

BACKGROUND OF THE DISCLOSURE

Field of the Disclosure

The present disclosure relates to a radio-frequency filter having resonators, a multiplexer, a radio-frequency front-end circuit, and a communication device.

Description of the Related Art

Hitherto, tunable radio-frequency filters (tunable filters) have been proposed as radio-frequency filters that support multiband functionality.

As a parallel arm circuit of such a tunable radio-frequency filter, for example, a first configuration in which a circuit made up of a capacitor and a switch connected in parallel with each other is connected in series with a parallel arm resonator is known (see, for example, Patent Document 1 and Patent Document 2). For example, a second configuration in which a circuit made up of a resonator and a switch connected in parallel with each other is connected in series with a parallel arm resonator is also known (see, for example, Patent Document 3).

Patent Document 1: U.S. Patent Application Publication No. 2009/0251235
Patent Document 2: Japanese Unexamined Patent Application Publication No. 2000-323961
Patent Document 3: Japanese Patent No. 5441095

BRIEF SUMMARY OF THE DISCLOSURE

With the above-described existing configurations, a resonant frequency that is a singular point at which the impedance of the parallel arm circuit is minimum changes in response to switching between an on state (conductive state) and off state (nonconductive state) of the switch. Therefore, the frequency of an attenuation pole that is provided by the resonant frequency can be changed. However, an anti-resonant frequency that provides a pass band and that is a singular point at which the impedance of the parallel arm circuit is maximum remains almost unchanged. Therefore, when the attenuation pole is changed such that the difference between the frequency of the attenuation pole and the frequencies of the pass band increases, there is inconvenience that a loss at an edge of the pass band near the attenuation pole after the change deteriorates (an insertion loss is large).

It is an object of the present disclosure to provide a radio-frequency filter, multiplexer, a radio-frequency front-end circuit, and a communication device that are able to change the frequencies of a pass band and the frequency of an attenuation pole while reducing a loss at an edge of the pass band.

To achieve the above object, a radio-frequency filter according to an aspect of the present disclosure includes a series arm circuit provided in a path connecting a first input/output terminal and a second input/output terminal, and a parallel arm circuit connected to a ground and a node in the path. The parallel arm circuit includes a first parallel arm resonator, a first variable frequency circuit connected in series with the first parallel arm resonator, and a second parallel arm resonator connected in parallel with a circuit in which the first parallel arm resonator and the first variable frequency circuit are connected in series. The first variable frequency circuit includes a third parallel arm resonator and a first switch connected in parallel with the third parallel arm resonator. The first variable frequency circuit is configured to change frequencies of a pass band of the radio-frequency filter and a frequency of an attenuation pole of the radio-frequency filter by switching between an on state and off state of the first switch. A resonant frequency of the first parallel arm resonator and a resonant frequency of the second parallel arm resonator are different from each other. An anti-resonant frequency of the first parallel arm resonator and an anti-resonant frequency of the second parallel arm resonator are different from each other. A resonant frequency of the third parallel arm resonator is higher than any of the resonant frequency of the first parallel arm resonator and the resonant frequency of the second parallel arm resonator.

With this configuration, at least one of the resonant frequencies and at least one of the anti-resonant frequencies of the parallel arm circuit both can be changed (varied) in response to switching between the on state and off state of the first switch. Thus, in response to the switching, both the frequency at a lower edge of the pass band and the frequency of an attenuation pole on a lower side of the pass band can be changed or both the frequency at a higher edge of the pass band and the frequency of an attenuation pole on a higher side of the pass band can be changed. Therefore, the frequencies of the pass band and the frequency of the attenuation pole can be changed while a loss at the edge of the pass band is reduced.

The resonant frequency of the first parallel arm resonator may be lower than the resonant frequency of the second parallel arm resonator, and the anti-resonant frequency of the first parallel arm resonator may be lower than the anti-resonant frequency of the second parallel arm resonator.

With this configuration, when the case where the first switch is on and the case where the first switch is off are compared with each other, a first resonant frequency that is the resonant frequency of the parallel arm circuit on the lowest frequency side and a first anti-resonant frequency that is the anti-resonant frequency of the parallel arm circuit on the lowest frequency side both can be changed. Specifically, in the parallel arm circuit, both the first resonant frequency and the first anti-resonant frequency change to a higher frequency side or a lower frequency side in response to switching between the on state and off state of the first switch. The first resonant frequency of the parallel arm circuit provides an attenuation pole of the filter on a lower side of the pass band, and the first anti-resonant frequency of the parallel arm circuit provides the pass band of the filter. Thus, the frequency at the lower edge of the pass band and the frequency of the attenuation pole on the lower side of the pass band can be changed while a loss at the lower edge of the pass band is reduced.

The resonant frequency of the first parallel arm resonator may be higher than the resonant frequency of the second parallel arm resonator, and the anti-resonant frequency of the first parallel arm resonator may be higher than the anti-resonant frequency of the second parallel arm resonator.

With this configuration, when the case where the first switch is on and the case where the first switch is off are compared with each other, the first anti-resonant frequency of the parallel arm circuit and a second resonant frequency next to the first resonant frequency (that is, the second resonant frequency from the lower frequency side) both can be changed. Specifically, in the parallel arm circuit, both the first anti-resonant frequency and the second resonant frequency change toward a higher frequency side or a lower frequency side in response to switching between the on state and off state of the first switch. The first anti-resonant frequency of the parallel arm circuit provides the pass band of the filter, and the second resonant frequency of the parallel arm circuit provides an attenuation pole of the filter on a higher side of the pass band. Thus, the frequency at the higher edge of the pass band and the frequency of the attenuation pole on the higher side of the pass band can be changed while a loss at the higher edge of the pass band is reduced.

The parallel arm circuit may further include a second switch connected in series with the second parallel arm resonator, and a circuit in which the second parallel arm resonator and the second switch are connected in series may be connected in parallel with the circuit in which the first parallel arm resonator and the first variable frequency circuit are connected in series.

With this configuration, frequencies different from the frequencies to be changed by the first switch can be changed in response to switching between the on state and off state of the second switch. In other words, in response to switching between the on state and off state of each of the first switch and the second switch, (i) the frequency at the lower edge of the pass band and the frequency of the attenuation pole on the lower side of the pass band and (ii) the frequency at the higher edge of the pass band and the frequency of the attenuation pole on the higher side of the pass band all can be changed. Therefore, by switching between the on state and off state of the first switch and switching between the on state and off state of the second switch independently of each other, (i) the frequency at the lower edge of the pass band and the frequency of the attenuation pole on the lower side of the pass band or (ii) the frequency at the higher edge of the pass band and the frequency of the attenuation pole on the higher side of the pass band can be changed independently of each other.

The parallel arm circuit may further include a fourth parallel arm resonator that is connected in parallel with the second switch and that makes up a second variable frequency circuit together with the second switch. The second variable frequency circuit may be connected in series with the second parallel arm resonator, and may be further configured to change the frequencies of the pass band of the radio-frequency filter and a frequency of an attenuation pole of the radio-frequency filter by switching between an on state and off state of the second switch. A resonant frequency of the fourth parallel arm resonator may be higher than any of the resonant frequency of the first parallel arm resonator and the resonant frequency of the second parallel arm resonator.

With this configuration, a frequency change width (variable frequency width) on the lower side of the pass band and a frequency change width on the higher side of the pass band can be equalized to each other. Thus, a center frequency can be changed while the pass band width is maintained.

Each of the first parallel arm resonator, the second parallel arm resonator, and the third parallel arm resonator may be an acoustic wave resonator having an interdigital transducer electrode made up of a plurality of electrode fingers formed on a substrate at least partially having piezoelectricity.

With this configuration, the first parallel arm resonator, the second parallel arm resonator, and the third parallel arm resonator are miniaturized, so miniaturization and cost reduction of the radio-frequency filter are achieved. An acoustic wave resonator generally exhibits characteristics of high quality factor, so low loss and high selectivity of the radio-frequency filter are achieved.

A film thickness of the plurality of electrode fingers of the third parallel arm resonator may be thinner than a film thickness of the plurality of electrode fingers of at least one of the first parallel arm resonator and the second parallel arm resonator.

The quality factor of the resonant frequency and anti-resonant frequency of an acoustic wave resonator varies depending on the film thickness of the plurality of electrode fingers, and the quality factor becomes maximum when the ratio of the film thickness to the wave length of surface acoustic waves is at a certain point between 5% and 10%. Thus, the resonant frequency of the third parallel arm resonator is higher than the resonant frequency of the at least one of the resonators, so, when the film thickness of the plurality of electrode fingers in the third parallel arm resonator is made thinner than the film thickness of the plurality of electrode fingers in the at least one of the resonators, both the third parallel arm resonator and the at least one of the resonators exhibit the characteristics of high quality factor. Thus, further low loss and high selectivity of the radio-frequency filter are achieved.

The plurality of electrode fingers of at least one of the first parallel arm resonator and the second parallel arm resonator may include a high-density metal layer made from a high-density metal that is one or more selected from among Au, Pt, Ta, Mo, and W, and the plurality of electrode fingers of the third parallel arm resonator may not include the high-density metal layer or may include the high-density metal layer thinner in film thickness than the high-density metal layer included in the plurality of electrode fingers of at least one of the first parallel arm resonator and the second parallel arm resonator.

With this configuration, the resonant frequency of the third parallel arm resonator can be changed to a higher frequency side while a ripple of filter characteristics in the pass band or in a stop band near the pass band is reduced. When no high-density metal layer is included or the film thickness of the high-density metal layer is thin, the quality factor of the anti-resonant frequency deteriorates. Since the anti-resonant frequency of the parallel arm resonator is a factor of deteriorating attenuation characteristics, attenuation characteristics are improved when the impedance is decreased by deteriorating the quality factor of the anti-resonant frequency.

The plurality of electrode fingers of at least one of the first parallel arm resonator and the second parallel arm resonator may be made from a multilayer body of the high-density metal layer and a low-density metal layer made from a low-density metal lower in density than the high-density metal.

A resonator having an interdigital transducer electrode made up of electrode fingers made from a multilayer body of a high-density metal layer and a low-density metal layer is able to decrease the acoustic velocity of surface acoustic waves (SAW) with mainly the high-density metal, so the size of the resonator is reduced, and characteristics of high quality factor are exhibited by the low-density metal layer made from the low-density metal lower in resistance than the high-density metal. Therefore, when the electrode fingers of at least one of the first parallel arm resonator and the second parallel arm resonator are configured as described above, the radio-frequency filter is miniaturized, and low loss and high selectivity of the radio-frequency filter are achieved.

The substrate may be lithium tantalate, lithium niobate, potassium niobate, quartz crystal, or a multilayer body of any two or more of lithium tantalate, lithium niobate, potassium niobate, and quartz crystal.

With this configuration, the first parallel arm resonator, the second parallel arm resonator, and the third parallel arm resonator that exhibit characteristics of high quality factor and wide band can be formed.

The first switch may be an FET switch made from GaAs or CMOS, or a diode switch.

Thus, the first switch is miniaturized, so miniaturization and cost reduction of the radio-frequency filter are achieved.

A multiplexer according to an aspect of the present disclosure includes a common terminal, a first filter that is any one of the above-described radio-frequency filters and of which the first input/output terminal or the second input/output terminal is connected to the common terminal, and a second filter of which one of input/output terminals is connected to the common terminal. The anti-resonant frequency of the third parallel arm resonator lies outside a pass band of the second filter.

When the anti-resonant frequency of the third parallel arm resonator lies outside the pass band of the second filter in this way, a loss in the pass band of the second filter is reduced.

A multiplexer according to another aspect of the present disclosure includes a common terminal, a first filter that is any one of the above-described radio-frequency filters and of which the first input/output terminal or the second input/output terminal is connected to the common terminal, and a second filter of which one of input/output terminals is connected to the common terminal. The anti-resonant frequency of the third parallel arm resonator and the anti-resonant frequency of the fourth parallel arm resonator both lie outside a pass band of the second filter.

When the anti-resonant frequency of the third parallel arm resonator and the anti-resonant frequency of the fourth parallel arm resonator both lie outside the pass band of the second filter in this way, a loss in the pass band of the second filter is reduced.

A radio-frequency front-end circuit according to an aspect of the present disclosure includes any one of the above-described radio-frequency filters and a control unit configured to control the first switch between the on state and the off state.

With this configuration, a high-performance radio-frequency front-end circuit that is able to change the frequencies of the pass band and the frequencies of the stop band while reducing a loss at edges of the pass band is provided.

A communication device according to an aspect of the present disclosure includes an RF signal processing circuit configured to process a radio-frequency signal that is transmitted or received by an antenna element, and the above-described radio-frequency front-end circuit configured to transfer the radio-frequency signal between the antenna element and the RF signal processing circuit.

With this configuration, a high-performance communication device that is able to change the frequencies of the pass band and the frequencies of the stop band while reducing a loss at edges of the pass band is provided.

With the tunable radio-frequency filter, multiplexer, radio-frequency front-end circuit, and communication device according to the present disclosure, the frequencies of the pass band and the frequencies of the attenuation poles can be changed while a loss at edges of the pass band is reduced.

DETAILED DESCRIPTION OF THE DISCLOSURE

Figure 1:
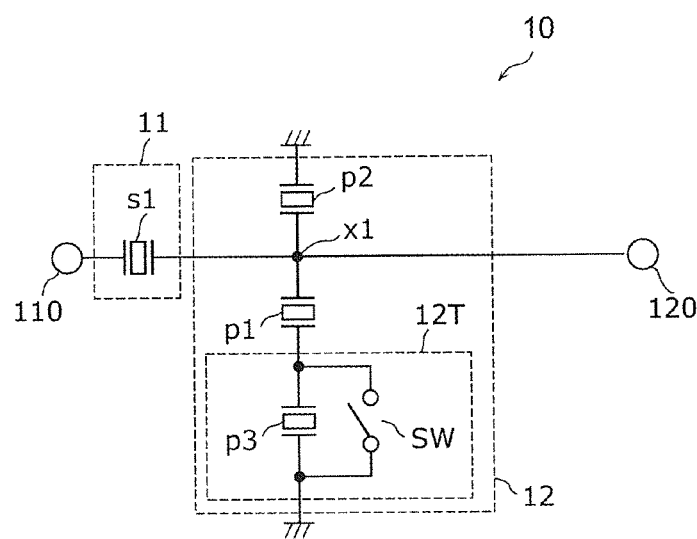
FIG. 1 is a circuit configuration diagram of a filter according to a first embodiment.

Hereinafter, embodiments of the present disclosure will be described in detail with reference to Examples and the drawings. All the embodiments that will be described below are general or specific examples. Numeric values, shapes, materials, elements, disposition and connection modes of the elements, and the like, that will be described below are illustrative, and are not intended to limit the present disclosure. Of the elements in the following embodiments, the elements not included in the independent claims will be described as optional elements. In addition, the size or size ratio of the elements shown in the drawings is not necessarily strict. In the drawings, like reference numerals denote substantially identical components, and the overlap description may be omitted or simplified. For circuit elements, such as resonators, constants can be adjusted as needed according to required specifications, or the like. Therefore, for circuit elements, constants can be different even with the same reference numerals. In the following description, the term "lower edge of a pass band" means the lowest frequency in a pass band. The term "higher edge of a pass band" means the highest frequency in a pass band. In the following description, the term "lower side of a pass band" means outside a pass band and lower (on a lower frequency side) than the pass band. The term "higher side of a pass band" means outside a pass band and higher (on a higher frequency side) than the pass band.

The resonant frequency of a resonator or circuit, unless otherwise specified, is a resonant frequency for forming a pass band of a filter including the resonator or the circuit or an attenuation pole near the pass band, and is a frequency at a resonant point that is a singular point at which the impedance of the resonator or the circuit is minimum (ideally, a point at which the impedance is zero).

The anti-resonant frequency of a resonator or circuit, unless otherwise specified, is an anti-resonant frequency for forming a pass band of a filter including the resonator or the circuit or an attenuation pole near the pass band, and is a frequency at an anti-resonant point that is a singular point at which the impedance of the resonator or the circuit is maximum (ideally, a point at which the impedance is infinite).

In the following embodiments, a series arm circuit and a parallel arm circuit are defined as follows.

A parallel arm circuit is a circuit disposed between a ground and a node in a path that connects a first input/output terminal and a second input/output terminal.

A series arm circuit is a circuit disposed between the first input/output terminal or second input/output terminal and a node in the path to which the parallel arm circuit is connected or a circuit disposed between one node in the path to which one parallel arm circuit is connected and another node in the path to which another parallel arm circuit is connected.

First Embodiment 1-1. Configuration

FIG. 1 is a circuit configuration diagram of a filter 10 according to a first embodiment. The filter 10 shown in the diagram is a radio-frequency filter including a series arm circuit 11 and a parallel arm circuit 12.

The series arm circuit 11 is provided in a path (series arm) connecting an input/output terminal 110 (first input/output terminal) and an input/output terminal 120 (second input/output terminal). In the present embodiment, the series arm circuit 11 is made up of a series arm resonator s1 consisting of one resonator. A resonator has a resonant frequency at which the impedance is minimum (ideally, zero) and an anti-resonant frequency at which the impedance is maximum (ideally, infinite). Therefore, in the present embodiment, the series arm circuit 11 has a resonant frequency and an anti-resonant frequency.

The series arm resonator s1 may be made up of a plurality of resonators and may be made up of a plurality of split resonators into which one resonator is, for example, serially split. The configuration of the series arm circuit 11 is not limited to the above configuration and may be, for example, a resonant circuit, such as a longitudinally-coupled resonator and an LC resonant circuit. The series arm circuit 11 is not limited to the resonant circuit and may be an inductance element or a capacitance element.

The parallel arm circuit 12 is connected to a ground (reference terminal) and a node x1 in the path connecting the input/output terminal 110 and the input/output terminal 120. The parallel arm circuit 12 includes a parallel arm resonator p1 (first parallel arm resonator), a parallel arm resonator p2 (second parallel arm resonator), and a variable frequency circuit 12T (first variable frequency circuit).

The parallel arm resonator p1 is a resonator connected between the node x1 and the ground.

The parallel arm resonator p2 is a resonator connected in parallel with a circuit in which the parallel arm resonator p1 and the variable frequency circuit 12T are connected in series. In other words, in the present embodiment, the parallel arm resonator p2 is connected between the node x1 and the ground.

The variable frequency circuit 12T is a circuit that is connected in series with the parallel arm resonator p1 and that changes the frequencies of a pass band of the filter 10 (radio-frequency filter) and the frequency of an attenuation pole of the filter 10. Changing frequencies means shifting frequencies.

Specifically, the variable frequency circuit 12T includes a parallel arm resonator p3 (third parallel arm resonator), and a switch SW (first switch) connected in parallel with the parallel arm resonator p3. The variable frequency circuit 12T changes the frequencies of the pass band of the filter 10 and the frequency of the attenuation pole of the filter 10 in response to switching between an on state (conductive state) and off state (nonconductive state) of the switch SW. The details of changing the frequencies will be described with reference to Examples of the present embodiment.

The parallel arm resonator p3 is a resonator connected in series with the parallel arm resonator p1 between the node x1 and the ground.

The switch SW is an SPST (single pole single throw) switch element. Examples of the switch SW include an FET (field effect transistor) switch made from GaAs or CMOS (complementary metal oxide semiconductor), and a diode switch. The switch SW is configured as, for example, a switch IC (integrated circuit). With such a configuration, the switch SW is miniaturized, so miniaturization and cost reduction of the filter 10 are achieved.

The switch SW is not limited to a semiconductor switch formed on or in a semiconductor substrate and may be a mechanical switch made up of MEMS (micro electro mechanical systems).

In the present embodiment, these parallel arm resonator p1 and variable frequency circuit 12T are provided such that the parallel arm resonator p1 is connected on a node x1 side and the variable frequency circuit 12T is connected on a ground side. Alternatively, the variable frequency circuit 12T may be connected on the node x1 side, and the parallel arm resonator p1 may be connected on the ground side. However, when the parallel arm resonator p1 is formed on or in a chip for resonators together with the other resonators and the switch SW is formed on or in a chip different from the above chip, the number of terminals of the chip for resonators is reduced because the parallel arm resonator p1 is connected on a series arm side with respect to the switch SW, so miniaturization is possible can be achieved. Therefore, from the viewpoint of miniaturization, it is desirable that the parallel arm resonator p1 be connected on the series arm side with respect to the variable frequency circuit 12T.

In the thus configured parallel arm circuit 12, the resonant frequencies and anti-resonant frequencies of the parallel arm resonators p1 to p3 satisfy the following first to third relationships. Each of the parallel arm resonators p1 to p3 has the anti-resonant frequency on a higher frequency side than the resonant frequency.

First, the resonant frequency (frp1) of the parallel arm resonator p1 and the resonant frequency (frp2) of the parallel arm resonator p2 are different from each other (frp1≠frp2). Second, the anti-resonant frequency (fap1) of the parallel arm resonator p1 and the anti-resonant frequency (fap2) of the parallel arm resonator p2 are different from each other (fap1≠fap2). Third, the resonant frequency (frp3) of the parallel arm resonator p3 is higher than any of the resonant frequency (frp1) of the parallel arm resonator p1 and the resonant frequency (frp2) of the parallel arm resonator p2 (frp1<frp3 and frp2<frp3).

Each of the parallel arm resonators p1 to p3 may be made up of a plurality of resonators and may be made up of a plurality of split resonators into which one resonator is, for example, serially split.

In the filter 10 configured as described above, when the switch SW is switched between the on state and the off state in accordance with a control signal from a control unit (not shown), such as an RFIC, the frequencies of the pass band and the frequency of the attenuation pole are changed. The thus configured filter 10 is able to, for example, change the pass band between a plurality of Bands regulated in 3GPP (Third Generation Partnership Project), and may be used as, for example, a tunable filter that supports LTE (Long Term Evolution).

For example, the control unit sets the switch SW in any one of the on state and the off state in an environment in which Band-A is used and sets the switch SW in the other one of the on state and the off state in an environment in which Band-B is used. In other words, for the switch SW, any one of the on state and the off state is selected in an environment, and the switch SW is fixed (remains unchanged) in the on state or in the off state in the environment.

1-2. Characteristics (Example 1)

Next, the characteristics of the filter 10 according to the present embodiment will be described by way of Example (Example 1).

Hereinafter, as Example 1, the case where the resonant frequency of the parallel arm resonator p1 is lower than the resonant frequency of the parallel arm resonator p2 (frp1<frp2) and the anti-resonant frequency of the parallel arm resonator p1 is lower than the anti-resonant frequency of the parallel arm resonator p2 (fap1<fap2) will be described.

Figure 2:
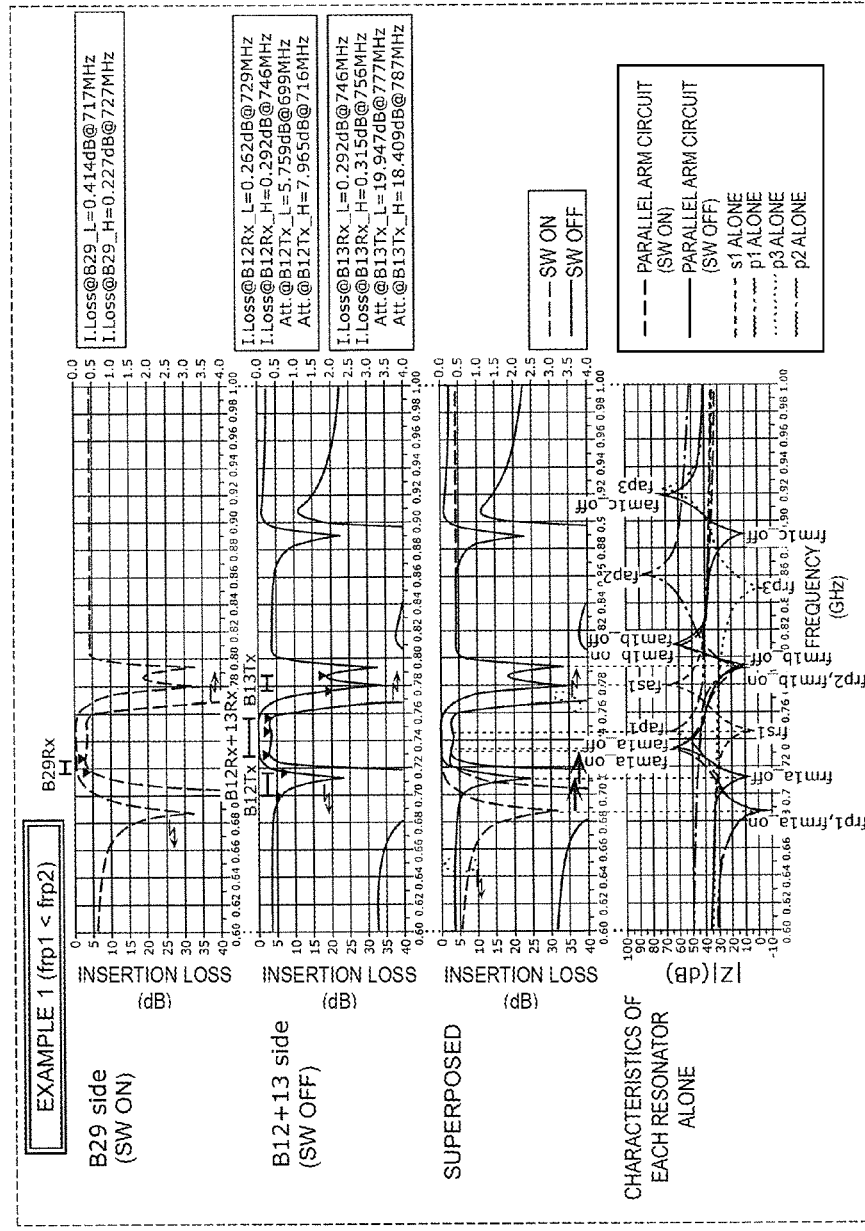
FIG. 2 shows graphs showing various characteristics of a filter according to Example (Example 1) of the first embodiment.

FIG. 2 shows graphs showing various characteristics of a filter according to Example 1. Specifically, FIG. 2 shows, from the top, filter characteristics (bandpass characteristics) when the switch SW is on, filter characteristics when the switch SW is off, a combination of these two filter characteristics, and impedance characteristics of each of resonators alone and parallel arm circuit alone.

Markers are added to the lower end and higher end of each of the pass band and stop band of each Band as needed in the graphs that show filter characteristics, and frequencies and insertion losses (I.Loss) or attenuations (Att.) at the markers are shown to the right side of the graphs. This also applies to graphs that show filter characteristics later.

As shown by the filter characteristics in the graphs, the filter of this Example is a tunable receiving filter that changes the frequencies of the pass band between B29Rx (717 MHz to 727 MHz) that is the receiving band of Band 29 and B12Rx+B13Rx (729 MHz to 746 MHz and 746 MHz to 756 MHz) that is a combined receiving band of Band 12 and Band 13. When the pass band is changed to B12Rx+B13Rx, B12Tx (699 MHz to 716 MHz) that is the transmission band of Band 12 and B13Tx (777 MHz to 787 MHz) that is the transmission band of Band 13 are set for the stop band. Band 29 is a receive only band (communication band), and no stop band is set.

As shown by the impedance characteristics in the graph, in this Example, the resonant frequencies (frp1 to frp3) and anti-resonant frequencies (fap1 to fap3) of the parallel arm resonators p1 to p3 satisfy the following relationships.

frp1<frp2<frp3 fap1<fap2<fap3

First, when the switch SW is on, the parallel arm resonator p3 is short-circuited by the switch SW, so the parallel arm circuit 12 establishes a circuit in which the parallel arm resonator p1 and the parallel arm resonator p2 are connected in parallel. Thus, in this state, the parallel arm circuit 12 has two resonant frequencies (frm1$a$_on, frm1$b$_on) and two anti-resonant frequencies (fam1$a$_on, fam1$b$_on) that satisfy the following relationship.

frp1=frm1$a$_on<fam1$a$_on<frp2=frm1$b$_on<fam1$b$_on

This principle will be described in resonance analysis (described later).

On the other hand, when the switch SW is off, the parallel arm circuit 12 establishes a circuit in which the parallel arm resonator p1 and the parallel arm resonator p3 are connected in series and a circuit in which the parallel arm resonator p2 is connected in parallel with the circuit in which the parallel arm resonator p1 and the parallel arm resonator p3 are connected in series. Thus, in this state, the parallel arm circuit 12 has three resonant frequencies (frm1$a$_off, frm1$b$_off, frm1$c$_off) and three anti-resonant frequencies (fam1$a$_off, fam1$b$_off, fam1$c$_off) that satisfy the following relationship.

frp1<frm1$a$_off<fam1$a$_off<frp2=frm1$b$_off<fam1$b$_off<frm1$c$_off<fam1$c$_off This principle will be described in resonance analysis (described later). When the switch SW is off, the parallel arm circuit 12 is actually influenced by an off capacitance that is a capacitive component when the switch SW is off. Ordinarily, the off capacitance of the switch SW is small enough (for example, 0.2 pF) as compared to the electrostatic capacity (for example, 5.0 pF; this definition will be described later) of a resonator, so the off capacitance of the switch SW almost does not influence the characteristics of the parallel arm circuit 12. Thus, for the sake of succinctness, the description will be made on the assumption that the switch SW is an ideal switch having no off capacitance (that is, the impedance is infinite).

Ordinarily, in a ladder band pass filter made up of a series arm circuit and a parallel arm circuit, a pass band is provided by an anti-resonant frequency (Fap) of the parallel arm circuit and a resonant frequency (Frs) of the series arm circuit, an attenuation pole on the lower side of the pass band is provided by the resonant frequency (Frp) of the parallel arm circuit, and an attenuation pole on the higher side of the pass band is provided by the anti-resonant frequency (Fas) of the series arm circuit.

In this Example, a pass band is provided by the resonant frequency of the series arm circuit 11 and a first anti-resonant frequency that is an anti-resonant frequency of the parallel arm circuit 12 on the lowest frequency side, attenuation poles on the lower side of the pass band are provided by a first resonant frequency that is a resonant frequency of the parallel arm circuit 12 on the lowest frequency side, and attenuation poles on the higher side of the pass band are provided by an anti-resonant frequency of the series arm circuit 11 and another resonant frequency of the parallel arm circuit 12.

In this respect, in this Example, the series arm circuit 11 is made up of only one series arm resonator s1, so the resonant frequency of the series arm circuit 11 is equal to the resonant frequency (frs1) of the series arm resonator s1, and the anti-resonant frequency of the series arm circuit 11 is equal to the anti-resonant frequency (fas1) of the series arm resonator s1. When the case where the switch SW is on and the case where the switch SW is off are compared with each other, it is found that the first resonant frequency (frm1$a$_on in the case of the on state, frm1$a$_off in the case of the off state) that is the resonant frequency of the parallel arm circuit 12 on the lowest frequency side and the first anti-resonant frequency (fam1$a$_on in the case of the on state, fam1$a$_off in the case of the off state) that is the anti-resonant frequency of the parallel arm circuit 12 on the lowest frequency side are changeable. Specifically, in the parallel arm circuit 12, both the first resonant frequency and the first anti-resonant frequency change toward a higher frequency side or a lower frequency side in response to switching between the on state and off state of the switch SW.

Therefore, in the filter of this Example, the frequency of the attenuation pole on the lower side of the pass band changes and the frequency at the lower edge of the pass band also changes in response to switching between the on state and off state of the switch SW. Thus, in this Example, the frequency at the lower edge of the pass band and the frequency of the attenuation pole on the lower side of the pass band can be changed while a loss at the lower edge of the pass band is reduced. Thus, the filter of this Example exhibits first filter characteristics having B29Rx as a pass band when the switch SW is on and exhibits second filter characteristics having B12Rx+13Rx as a pass band and B12Tx, B13Tx as stop bands when the switch SW is off.

1-3. Comparison with Comparative Examples

Next, the characteristics of the thus configured Example 1 will be described in comparison with Comparative Example 1 and Comparative Example 2.

1-3-1. Comparative Example 1

First, the configuration and characteristics of Comparative Example 1 will be described.

Figure 3:
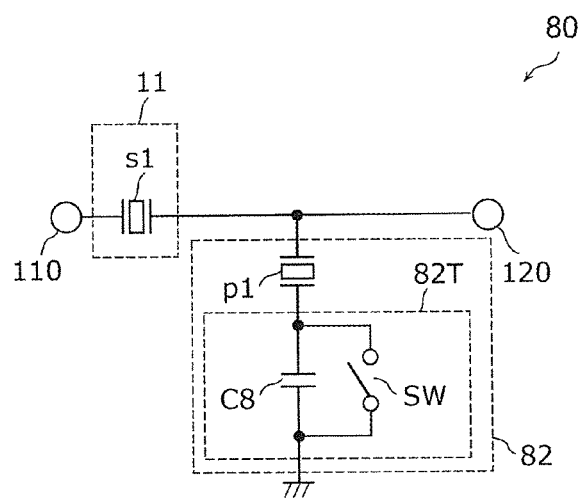
FIG. 3 is a circuit configuration diagram of a filter according to Comparative Example 1.

FIG. 3 is a circuit configuration diagram of a filter 80 according to Comparative Example 1.

As shown in the diagram, the filter 80 according to Comparative Example 1 includes a parallel arm circuit 82 in which no parallel arm resonator p2 is provided and the parallel arm resonator p3 is replaced with a capacitor C8, in place of the parallel arm circuit 12 of the filter 10 according to the first embodiment. In other words, the parallel arm circuit 82 includes a variable frequency circuit 82T made up of the capacitor C8 and the switch SW.

Even in the thus configured filter 80 according to Comparative Example 1, frequencies of a pass band and a frequency at an attenuation pole are changed by switching between the on state and off state of the switch SW. Specifically, the filter 80, as in the case of the filter of Example 1, changes the pass band between B29Rx and B12Rx+B13Rx.

Figure 4:
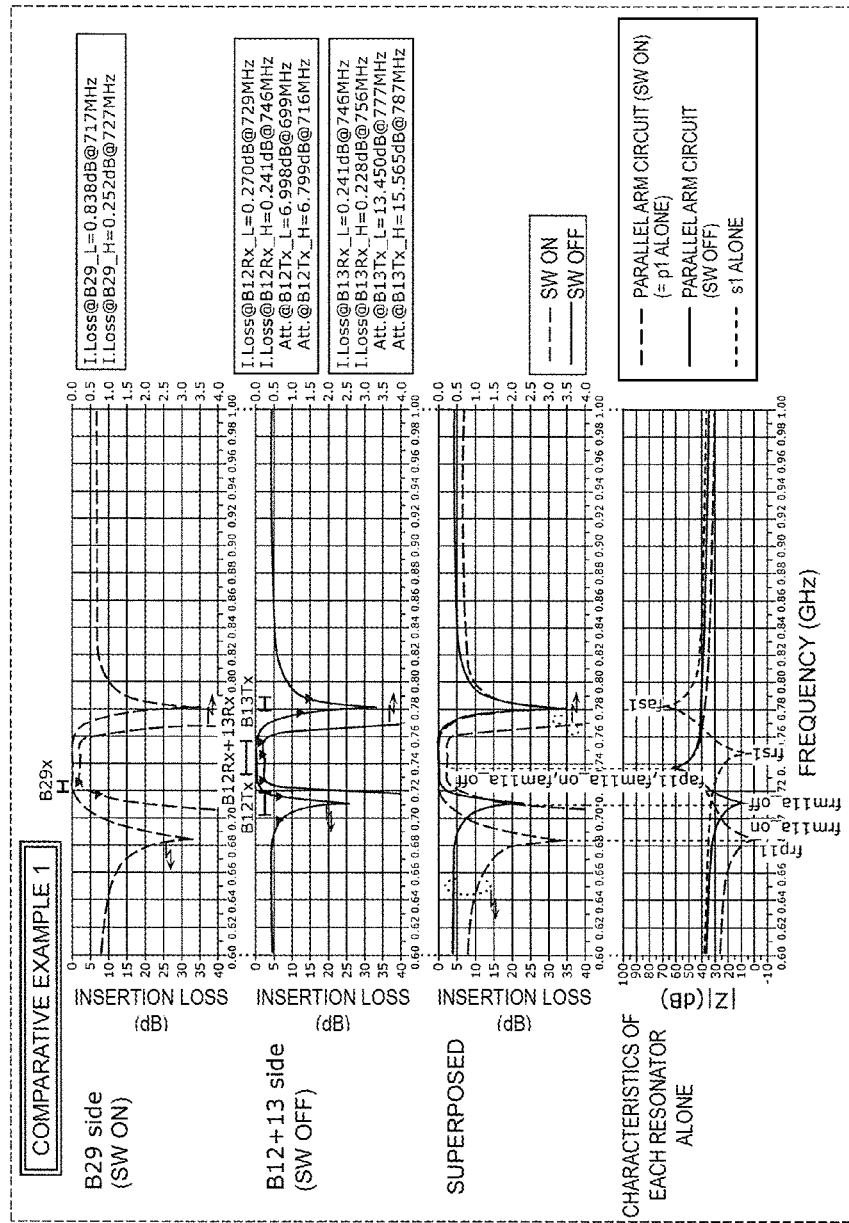
FIG. 4 shows graphs showing various characteristics of the filter according to Comparative Example 1.

FIG. 4 shows graphs showing various characteristics of the filter 80 according to Comparative Example 1. Specifically, FIG. 4 shows, from the top, filter characteristics when the switch SW is on, filter characteristics when the switch SW is off, a combination of these two filter characteristics, and impedance characteristics of each of resonators alone and parallel arm circuit alone.

First, when the switch SW is on, the capacitor C8 is short-circuited by the switch SW, so the parallel arm circuit 82 is established by only the parallel arm resonator p1. Thus, in this state, the parallel arm circuit 82 exhibits the same impedance characteristics as the impedance characteristics of the parallel arm resonator p1, so the parallel arm circuit 82 has one resonant frequency (frm11$a$_on) and one anti-resonant frequency (fam11$a$_on) that satisfy the following relationship.

$$frp11=frm11a\_on<fam11a\_on=fap11$$

In other words, the parallel arm circuit 82 has only a resonant frequency equal to the resonant frequency (frp11) of the parallel arm resonator p1 and an anti-resonant frequency equal to the anti-resonant frequency (fap11) of the parallel arm resonator p1.

On the other hand, when the switch SW is off, the parallel arm circuit 82 establishes a circuit in which the parallel arm resonator p1 and the capacitor C8 are connected in series. Thus, in this state, the parallel arm circuit 82 has one resonant frequency (frm11$a$_off) and one anti-resonant frequency (fam11$a$_off) that satisfy the following relationship.

$$frp11<frm11a\_off<fap11=fam11a\_off$$

This principle will be described in resonance analysis (described later).

In this Comparative Example, a pass band is provided by the anti-resonant frequency of the parallel arm circuit 82 and the resonant frequency of the series arm circuit 11, an attenuation pole on the lower side of the pass band is provided by the resonant frequency of the parallel arm circuit 82, and an attenuation pole on the higher side of the pass band is provided by the anti-resonant frequency of the series arm circuit 11.

In this respect, in this Comparative Example, as in the case of the above-described Example 1, the resonant frequency of the series arm circuit 11 is equal to the resonant frequency (frs1) of the series arm resonator s1, and the anti-resonant frequency of the series arm circuit 11 is equal to the anti-resonant frequency (fas1) of the series arm resonator s1. When the case where the switch SW is on and the case where the switch SW is off are compared with each other, it is found that, in the parallel arm circuit 82, the resonant frequency (frm11$a$_on in the case of the on state, frm11$a$_off in the case of the off state) changes and the anti-resonant frequency (fam11$a$_on in the case of the on state, fam11$a$_off in the case of the off state) remains unchanged. In other words, only the resonant frequency of the parallel arm circuit 82 changes toward a higher frequency side or a lower frequency side in response to switching between the on state and off state of the switch SW.

Therefore, in the filter 80 of Comparative Example 1, the frequency at the lower edge of the pass band and the frequency of the attenuation pole on the lower side of the pass band change in response to switching between the on state and off state of the switch SW; however, a loss at the lower edge of the pass band when the switch SW is on deteriorates. Thus, the filter 80 of this Comparative Example exhibits first filter characteristics having B29Rx as a pass band when the switch SW is on and exhibits second filter characteristics having B12Rx+13Rx as a pass band and B12Tx, B13Tx as stop bands when the switch SW is off; however, an insertion loss at the lower edge of the pass band is large in the second filter characteristics.

1-3-2. Comparative Example 2

Next, the configuration and characteristics of Comparative Example 2 will be described.

Figure 5:
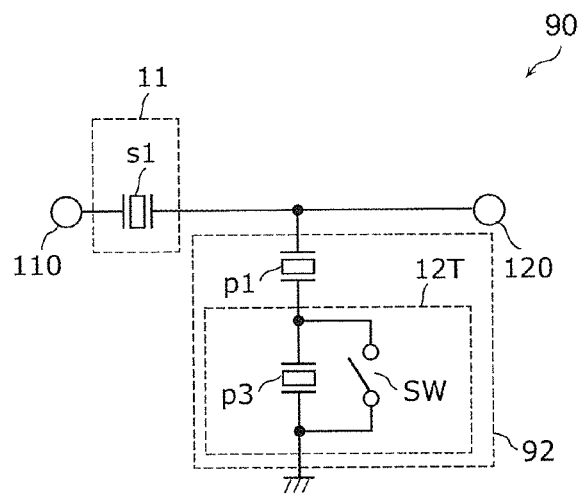
FIG. 5 is a circuit configuration diagram of a filter according to Comparative Example 2.

FIG. 5 is a circuit configuration diagram of a filter 90 according to Comparative Example 2.

As shown in the diagram, the filter 90 according to Comparative Example 2 includes a parallel arm circuit 92 in which no parallel arm resonator p2 is provided, in place of the parallel arm circuit 12 of the filter 10 according to the first embodiment.

Even in the thus configured filter 90 according to Comparative Example 2, frequencies of a pass band and a frequency at an attenuation pole are changed by switching between the on state and off state of the switch SW. Specifically, the filter 90, as in the case of the filter of Example 1, changes the pass band between B29Rx and B12Rx+B13Rx.

Figure 6:
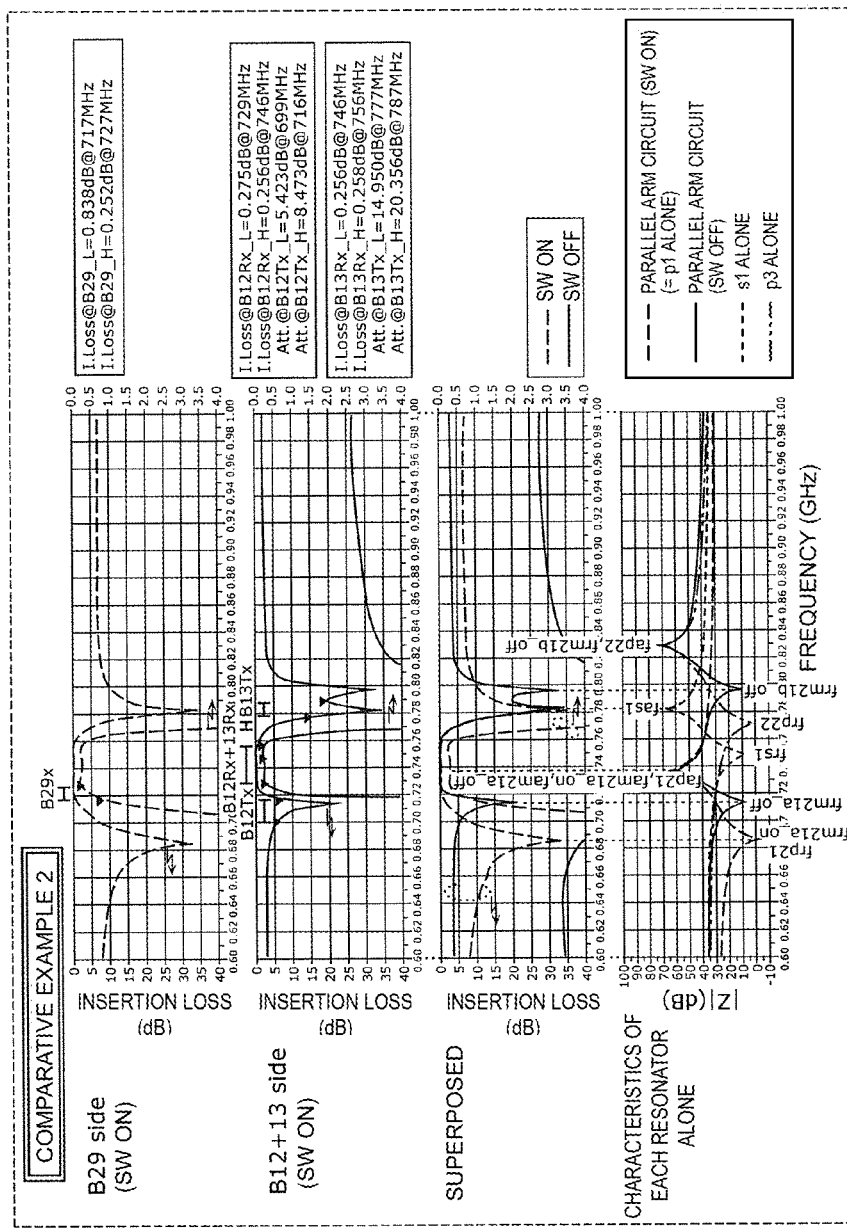
FIG. 6 shows graphs showing various characteristics of the filter according to Comparative Example 2.

FIG. 6 shows graphs showing various characteristics of the filter 90 according to Comparative Example 2. Specifically, FIG. 6 shows, from the top, filter characteristics when the switch SW is on, filter characteristics when the switch SW is off, a combination of these two filter characteristics, and impedance characteristics of each of resonators alone and parallel arm circuit alone.

First, when the switch SW is on, the parallel arm resonator p3 is short-circuited by the switch SW, so the parallel arm circuit 92 is established by only the parallel arm resonator p1. Thus, in this state, the parallel arm circuit 92 exhibits the same impedance characteristics as the impedance characteristics of the parallel arm resonator p1, so the parallel arm circuit 92 has one resonant frequency (frm21$a$_on) and one anti-resonant frequency (fam21$a$_on) that satisfy the following relationship.

$$frp21 = frm21a\_on < fam21a\_on = fap21$$

In other words, the parallel arm circuit 92 has only a resonant frequency equal to the resonant frequency (frp21) of the parallel arm resonator p1 and an anti-resonant frequency equal to the anti-resonant frequency (fap21) of the parallel arm resonator p1.

On the other hand, when the switch SW is off, the parallel arm circuit 92 establishes a circuit in which the parallel arm resonator p1 and the parallel arm resonator p3 are connected in series. Thus, in this state, the parallel arm circuit 92 has two resonant frequencies (frm21$a$_off, frm21$b$_off) and two anti-resonant frequencies (fam21$a$_off, fam21$b$_off) that satisfy the following relationship.

$$frp21 < frm21a\_off < fap21 = fam21a\_off < frm21b\_off < fam21b\_off$$

This principle will be described in resonance analysis (described later).

In this Comparative Example, when the parallel arm circuit 92 has one of each of the resonant frequency and the anti-resonant frequency, a pass band is provided by the anti-resonant frequency of the parallel arm circuit 92 and the resonant frequency of the series arm circuit 11, an attenuation pole on the lower side of the pass band is provided by the resonant frequency of the parallel arm circuit 92, and an attenuation pole on the higher side of the pass band is provided by the anti-resonant frequency of the series arm circuit 11. When the parallel arm circuit 92 has two of each of the resonant frequency and the anti-resonant frequency, a pass band is provided by the anti-resonant frequency of the parallel arm circuit 92 on the lower frequency side and the resonant frequency of the series arm circuit 11, an attenuation pole on the lower side of the pass band is provided by the resonant frequency of the parallel arm circuit 92 on the lower frequency side, and an attenuation pole on the higher side of the pass band is provided by the anti-resonant frequency of the series arm circuit 11 and the resonant frequency of the parallel arm circuit 92 on the higher frequency side.

In this respect, in this Comparative Example, as in the case of the above-described Example 1, the resonant frequency of the series arm circuit 11 is equal to the resonant frequency (frs1) of the series arm resonator s1, and the anti-resonant frequency of the series arm circuit 11 is equal to the anti-resonant frequency (fas1) of the series arm resonator s1. When the case where the switch SW is on and the case where the switch SW is off are compared with each other, it is found that the resonant frequency (frm21$a$_on in the case of the on state, frm21$a$_off in the case of the off state) of the parallel arm circuit 92 changes and the anti-resonant frequency (fam21$a$_on in the case of the on state, fam21$a$_off in the case of the off state) of the parallel arm circuit 92 remains unchanged. When the switch SW is off, a new resonant frequency (frm21$b$_off) and a new anti-resonant frequency (fam21$b$_off) appear on the higher side of the pass band (higher frequency side of the pass band) of the filter 90. In other words, only the resonant frequency of the parallel arm circuit 92 on the lower side of the pass band changes toward a higher frequency side or a lower frequency side in response to switching between the on state and off state of the switch SW, and the presence or absence of the resonant frequency and anti-resonant frequency on the higher side of the pass band is switched.

Therefore, in the filter 90 of Comparative Example 2, the frequency of the attenuation pole on the lower side of the pass band changes and the frequency of the attenuation pole on the higher side of the pass band changes in response to switching between the on state and off state of the switch SW. Thus, the filter 90 of this Comparative Example exhibits first filter characteristics having B29Rx as a pass band when the switch SW is on and exhibits second filter characteristics having B12Rx+13Rx as a pass band and B12Tx, B13Tx as stop bands when the switch SW is off.

1-3-3. Comparison of Characteristics

Figure 7:
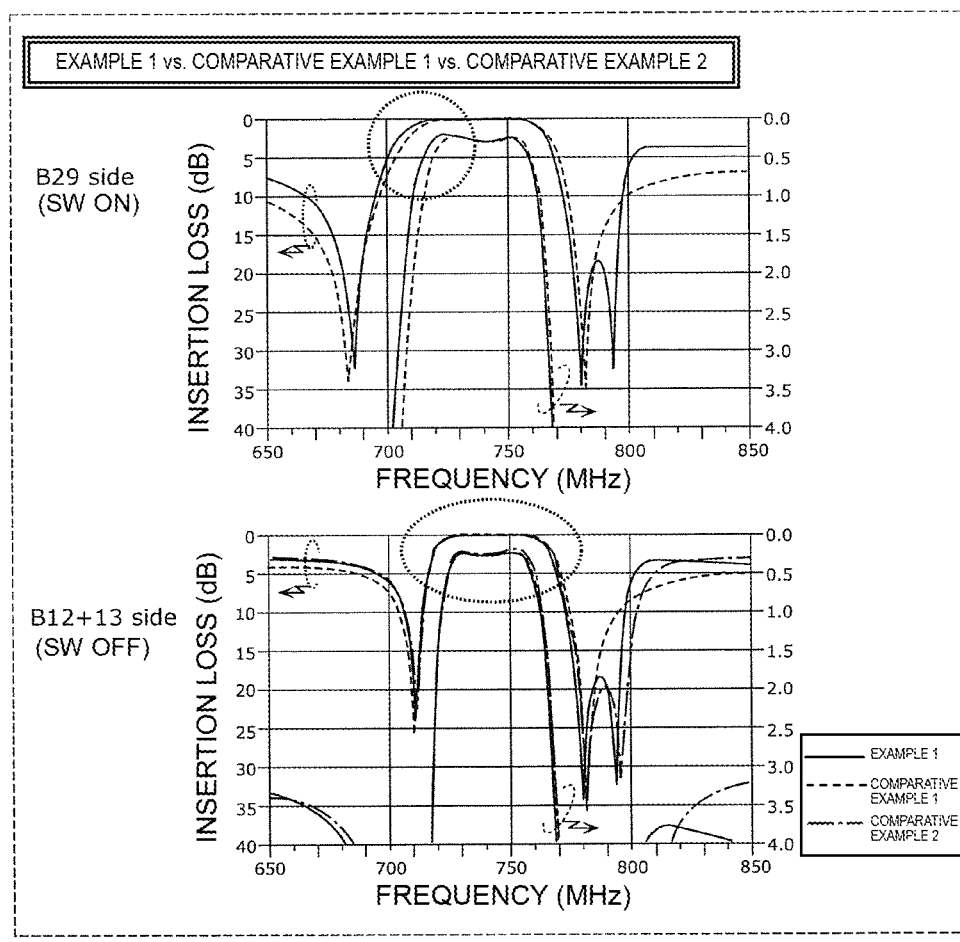
FIG. 7 shows comparison graphs of filter characteristics of the filters according to Example 1 and Comparative Examples 1 and 2.

FIG. 7 shows comparison graphs of filter characteristics of the filters according to Example 1 and Comparative Examples 1 and 2. Specifically, the top graph shows comparison graphs of filter characteristics when the switch SW is on, and the bottom graph shows comparison graphs of filter characteristics when the switch SW is off. The filter characteristics of Comparative Example 1 and the filter characteristics of Comparative Example 2 substantially coincide with each other, and these coincide with each other particularly in the top graph.

As shown by the top graph, when the switch SW is on, that is, when the frequency at the lower edge of the pass band and the frequency of the attenuation pole on the lower side of the pass band are changed to the lower frequency side, Example 1 is able to reduce a loss at the lower edge of the pass band as compared to Comparative Example 1 and Comparative Example 2 (see the portion surrounded by the dotted line in the graph).

Specifically, in Comparative Example 1 and Comparative Example 2, in response to switching between the on state and off state of the switch SW, the resonant frequency of the parallel arm circuit, which provides the attenuation pole on the lower side of the pass band, changes but the anti-resonant frequency of the parallel arm circuit, which provides the pass band, remains unchanged. Thus, in Comparative Example 1 and Comparative Example 2, when the frequency at the lower edge of the pass band and the frequency of the attenuation pole on the lower side of the pass band are changed to the lower frequency side, only the attenuation pole on the lower side of the pass band changes toward a lower frequency side and, as a result, the steepness of an attenuation slope on the lower side of the pass band decreases. Therefore, there is inconvenience that a loss at the lower edge of the pass band is large.

In contrast to this, in Example 1, the resonant frequency of the parallel arm circuit 12, which provides the attenuation pole on the lower side of the pass band, changes and the anti-resonant frequency of the parallel arm circuit 12, which provides the pass band, also changes in response to switching between the on state and off state of the switch SW. Both the resonant frequency and the anti-resonant frequency change toward a higher frequency side or a lower frequency side. Thus, in Example 1, when the frequency at the lower edge of the pass band and the frequency of the attenuation pole on the lower side of the pass band are changed to the lower frequency side, not only the frequency of the attenuation pole on the lower side of the pass band but also the frequency at the lower edge of the pass band changes toward a lower frequency side and, as a result, the steepness of an attenuation slope on the lower side of the pass band is maintained. Therefore, a loss at the lower edge of the pass band is reduced.

On the other hand, as shown by the bottom graph, when the switch SW is off, that is, when changed to the higher frequency side, Example 1 maintains a loss in the pass band at the same level (see the portion surrounded by the dotted line in the graph) as compared to Comparative Example 1 and Comparative Example 2.

1-4. Description of Principle Through Resonance Analysis

A principle on which the resonant frequency and the anti-resonant frequency as described above are obtained will be described by way of analysis (resonance analysis) of impedance characteristics (resonant characteristics) using an equivalent circuit model of a resonator.

1-4-1. Resonator Alone

First, the resonant characteristics of a resonator alone will be described.

Figure 8A:
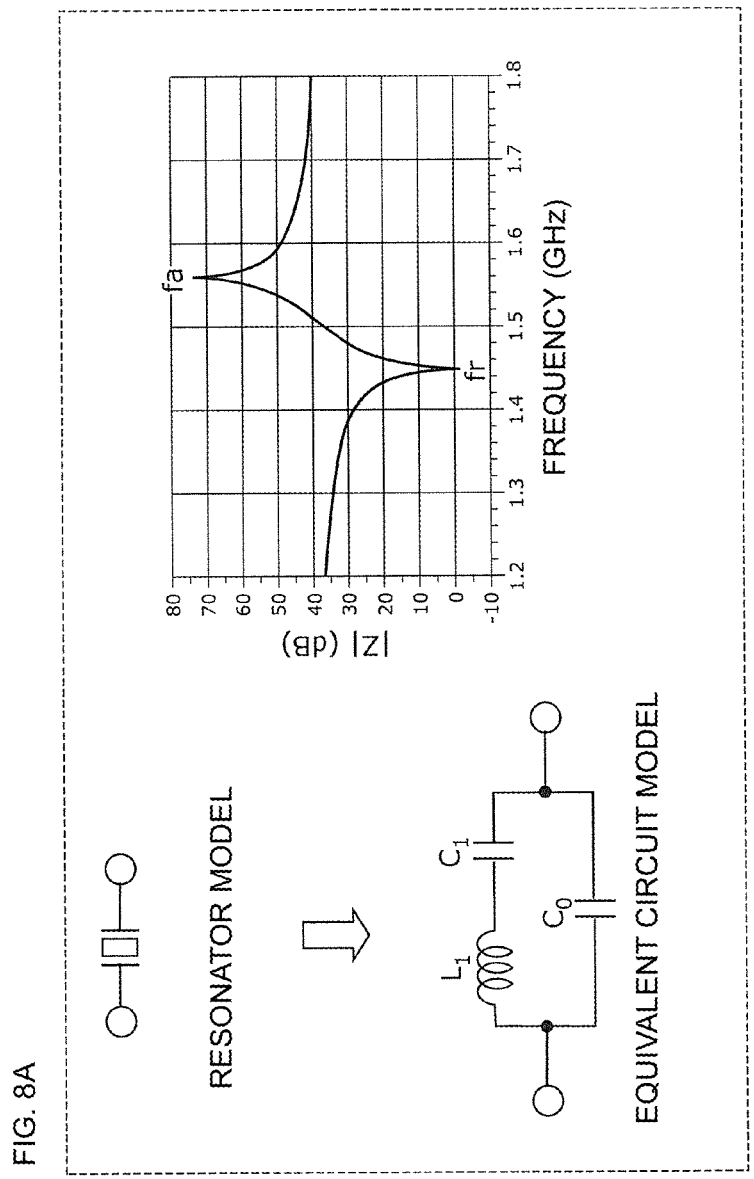
FIG. 8A shows an equivalent circuit model of a resonator and its resonant characteristics.

FIG. 8A shows an equivalent circuit model of one resonator and its resonant characteristics. As shown in the diagram, the resonator is represented by a circuit in which a capacitor $C_1$ and an inductor $L_1$ are connected in series and a circuit in which a capacitor $C_0$ is connected in parallel with the circuit in which the capacitor $C_1$ and the inductor $L_1$ are connected in series. The capacitor $C_0$ is the electrostatic capacity of the resonator. The electrostatic capacity is uniquely determined by the structure, design parameters, and the like, of the resonator although the detailed definition thereof will be described later.

In the above equivalent circuit, the resonant frequency fr of the resonator is determined by the circuit in which the capacitor $C_1$ and the inductor $L_1$ are connected in series and is a frequency at which the impedance of the equivalent circuit is zero, so the resonant frequency fr is expressed by the mathematical expression 2 when the mathematical expression 1 is solved.

[Mathematical Expression 1]

$$Z = 0 = j\omega L_1 + \frac{1}{j\omega C_1} \qquad (1)$$

[Mathematical Expression 2]

$$f_r = \frac{1}{2\pi\sqrt{L_1 C_1}} \qquad (2)$$

The anti-resonant frequency fa of the resonator is a frequency at which the admittance Y of the equivalent circuit is zero, so the anti-resonant frequency fa is expressed by the mathematical expression 4 when the mathematical expression 3 is solved.

[Mathematical Expression 3]

$$Y = \frac{1}{Z} = 0 = \frac{1}{\frac{1}{j\omega C_0}} + \frac{1}{j\omega L_1 + \frac{1}{j\omega C_1}} \qquad (3)$$

[Mathematical Expression 4]

$$f_a = \frac{\sqrt{1 + \frac{C_1}{C_0}}}{2\pi\sqrt{L_1 C_1}} = f_r\sqrt{1 + \frac{C_1}{C_0}} \qquad (4)$$

Through the mathematical expression 2 and the mathematical expression 4, as shown in the right-side graph of FIG. 8A, the anti-resonant frequency fa appears on the higher frequency side than the resonant frequency fr.

In other words, the resonator has one resonant frequency, and one anti-resonant frequency that lies on the higher frequency side than the resonant frequency.

1-4-2. Connecting Impedance Element in Series with Resonator

Next, the resonant characteristics when an impedance element is connected in series with the resonator will be described by way of an equivalent circuit model.

Figure 8B:
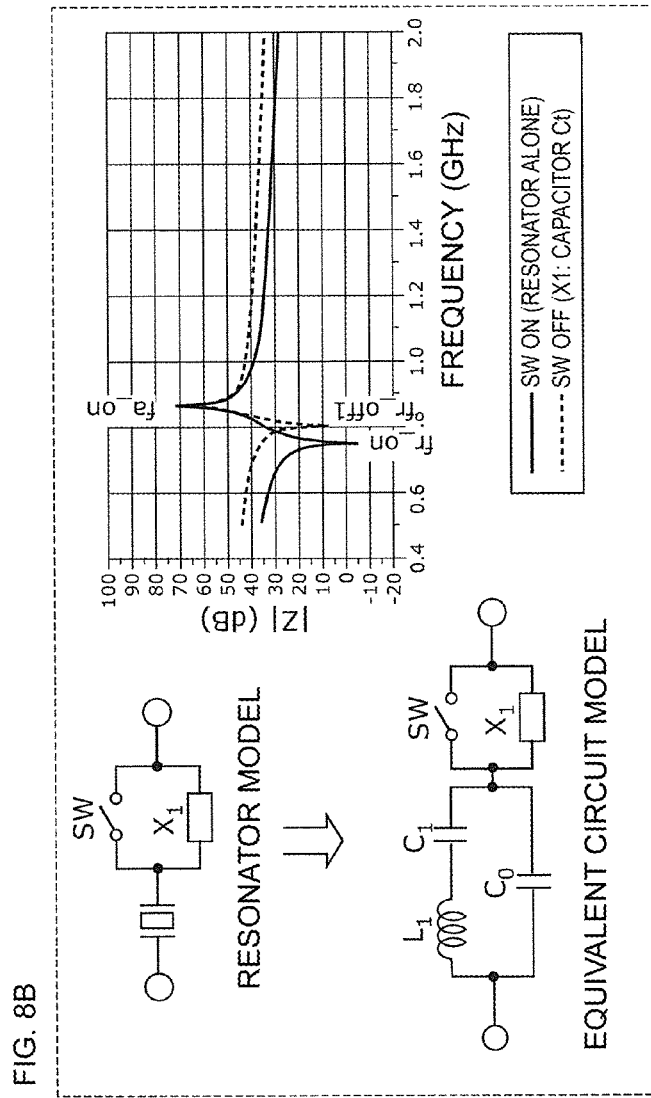
FIG. 8B shows an equivalent circuit model when an impedance element is connected in series with a resonator and its resonant characteristics.

FIG. 8B shows an equivalent circuit model when an impedance element $X_1$ is connected in series with a resonator and its resonant characteristics. As shown in the diagram, a parallel circuit of the impedance element $X_1$ and the switch SW is connected to the resonator that is represented by the circuit in which the capacitor $C_0$ is connected in parallel with the circuit in which the capacitor $C_1$ and the inductor $L_1$ are connected in series.

First, the resonant characteristics of the equivalent circuit when the switch SW is on will be described. When the switch SW is on, the impedance element $X_1$ is short-circuited, so the resonant frequency fr_on and the anti-resonant frequency fa_on are respectively the same as the resonant frequency fr and the anti-resonant frequency fa in FIG. 8A and are expressed by the mathematical expression 5 and the mathematical expression 6.

[Mathematical Expression 5]

$$f_r\_\text{on} = \frac{1}{2\pi\sqrt{L_1 C_1}} \quad (5)$$

[Mathematical Expression 6]

$$f_a\_\text{on} = \frac{\sqrt{1 + \frac{C_1}{C_0}}}{2\pi\sqrt{L_1 C_1}} = f_r\_\text{on}\sqrt{1 + \frac{C_1}{C_0}} \quad (6)$$

Next, the case where the switch SW is off will be described separately when the impedance element $X_1$ is a capacitor $C_t$ or when the impedance element $X_1$ is an inductor.

A resonant frequency fr_off1 when the switch SW is off is a frequency at which the impedance Z of the equivalent circuit is zero, so the resonant frequency fr_off1 is expressed by the mathematical expression 8 when the mathematical expression 7 is solved.

[Mathematical Expression 7]

$$Z = 0 = \frac{1}{\frac{1}{\frac{1}{j\omega C_0} + \frac{1}{j\omega L_1 + \frac{1}{j\omega C_1}}}} + \frac{1}{j\omega C_t} \quad (7)$$

[Mathematical Expression 8]

$$f_r\_\text{off1} = \frac{\sqrt{\frac{C_0 + C_1 + C_t}{L_1 C_1 C_t + L_1 C_0 C_t}}}{2\pi} \quad (8)$$

On the other hand, an anti-resonant frequency fa_off1 when the switch SW is off is the same as the anti-resonant frequency fa_on when the switch SW is on and is expressed by the mathematical expression 9.

[Mathematical Expression 9]

$$f_r\_\text{off1} = \frac{\sqrt{1 + \frac{C_1}{C_0}}}{2\pi\sqrt{L_1 C_1}} \quad (9)$$

Through the mathematical expression 5, the mathematical expression 6, the mathematical expression 8, and the mathematical expression 9, when the impedance element $X_1$ is a capacitor $C_t$, the anti-resonant frequencies fa_on and fa_off1 coincide with each other regardless of switching between the on state and off state of the switch SW, as shown in the right-side graph of FIG. 8B. On the other hand, the resonant frequency appears to change toward a higher frequency side when the switch SW is off (fr_off1) as compared to when the switch SW is on (fr_on).

1-4-3. Two Resonators are Connected in Parallel

Next, the characteristics when two resonators are connected in parallel will be described by way of an equivalent circuit model.

Figure 8C:
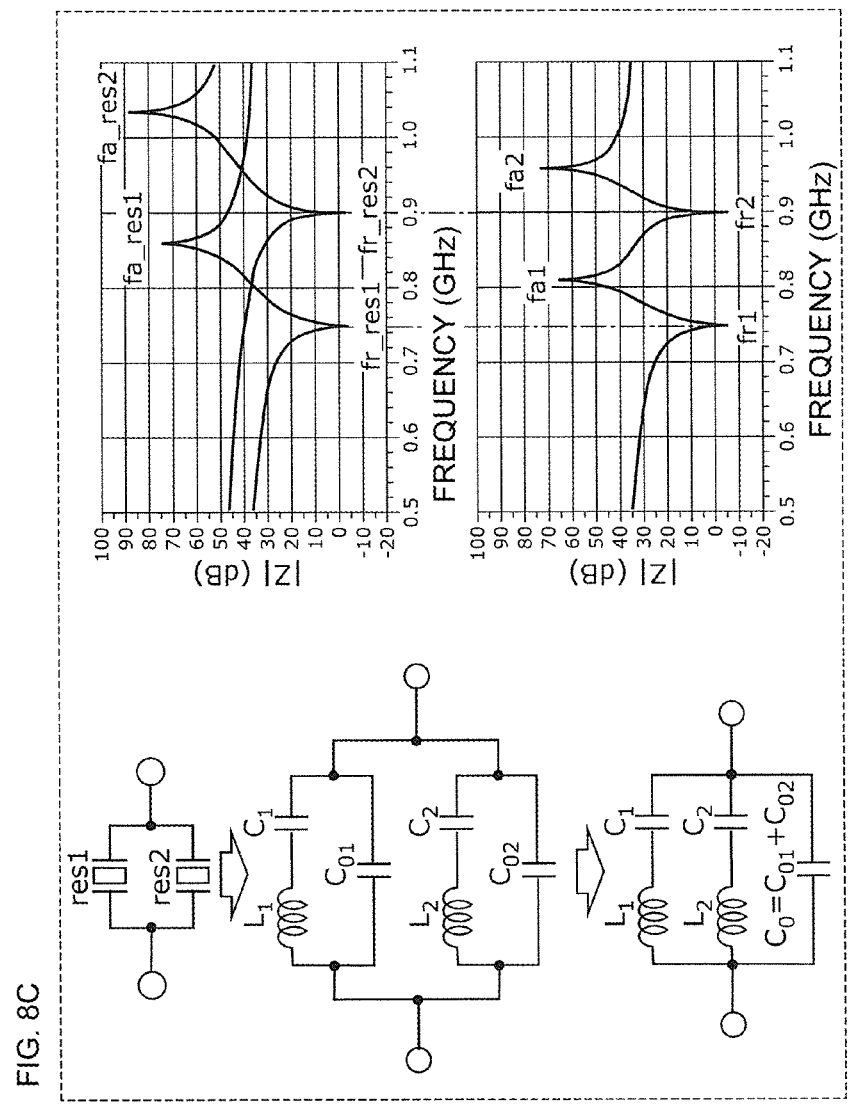
FIG. 8C shows an equivalent circuit model of two resonators connected in parallel and its resonant characteristics.

FIG. 8C shows an equivalent circuit model of two resonators connected in parallel and its resonant characteristics. The drawing shows a model in which resonators res1, res2 are connected in parallel. The resonator res1 is represented by a circuit in which the capacitor $C_1$ and the inductor $L_1$ are connected in series and a circuit in which the capacitor $C_{01}$ is connected in parallel with the circuit in which the capacitor $C_1$ and the inductor $L_1$ are connected in series. The resonator res2 is represented by a circuit in which a capacitor $C_2$ and an inductor $L_2$ are connected in series and a circuit in which a capacitor $C_{02}$ is connected in parallel with the circuit in which the capacitor $C_2$ and the inductor $L_2$ are connected in series. The capacitors $C_{01}$, $C_{02}$ are respectively the electrostatic capacities of the resonators res1, res2. A circuit in which these resonator res1 and resonator res2 are connected in parallel is represented by an equivalent circuit shown at the lower left side of FIG. 8C. In other words, the circuit in which the resonators res1, res2 are connected in parallel is represented by the circuit in which the capacitor $C_1$ and the inductor $L_1$ are connected in series and the circuit in which the circuit connecting the capacitor $C_2$ and the inductor $L_2$ in series and the capacitor $C_0$ ($=C_{01}+C_{02}$) are connected in parallel.

In the equivalent circuit, the resonant frequency fr of the resonator is determined by the circuit in which the capacitor $C_1$ and the inductor $L_1$ are connected in series and is represented by the mathematical expression 1.

In the equivalent circuit, two resonant frequencies are determined. The resonant frequency fr1 is determined by the circuit in which the capacitor $C_1$ and the inductor $L_1$ are connected in series. The resonant frequency fr2 is determined by the circuit in which the capacitor $C_2$ and the inductor $L_2$ are connected in series. The resonant frequencies fr1, fr2 are expressed by the mathematical expression 10.

[Mathematical Expression 10]

$$f_r 1 = \frac{1}{2\pi\sqrt{L_1 C_1}} \quad f_r 2 = \frac{1}{2\pi\sqrt{L_2 C_2}} \quad (10)$$

In other words, the two resonant frequencies fr1, fr2 that are represented by the equivalent circuit are respectively substantially equal to the resonant frequency fr_res1 of the resonator res1 and the resonant frequency fr_res2 of the resonator res2.

The anti-resonant frequency of the equivalent circuit is a frequency at which the admittance Y of the equivalent circuit is zero, so it is found that the equivalent circuit has two anti-resonant frequencies (fa1, fa2) as expressed by the mathematical expression 12 when the mathematical expression 11 is solved.

[Mathematical Expression 11]

$$Y = \frac{1}{Z} = 0 = j\omega C_0 + \frac{1}{j\omega L_1 + \frac{1}{j\omega C_1}} + \frac{1}{j\omega L_2 + \frac{1}{j\omega C_2}} \quad (11)$$

[Mathematical Expression 12]

$$f_a1 = \frac{\sqrt{\frac{-b - \sqrt{b^2 - 4ac}}{2a}}}{2\pi}$$

$$f_a2 = \frac{\sqrt{\frac{-b + \sqrt{b^2 - 4ac}}{2a}}}{2\pi} \quad (12)$$

$$a = L_1 L_2 C_0 C_1 C_2$$
$$b = -L_1 C_0 C_1 - L_2 C_0 C_2 - L_1 C_1 C_2 - L_2 C_1 C_2$$
$$c = C_0 + C_1 + C_2$$

It is found that the anti-resonant frequencies fa1, fa2 that are obtained from the mathematical expression 12 are different from the anti-resonant frequencies (indicated as fa_res1, fa_res2 in the graph of FIG. 8C) of the resonators alone, which are obtained from the mathematical expression 3. The anti-resonant frequency fa1 that is derived from the mathematical expression 11 is lower than the anti-resonant frequency fa_res1 of the resonator res1 alone, and the anti-resonant frequency fa2 is lower than the anti-resonant frequency fa_res2 of the resonator res2 alone.

1-4-4. Two Resonators are Connected in Series

Next, the characteristics when two resonators are connected in series will be described by way of an equivalent circuit model.

Figure 8D:
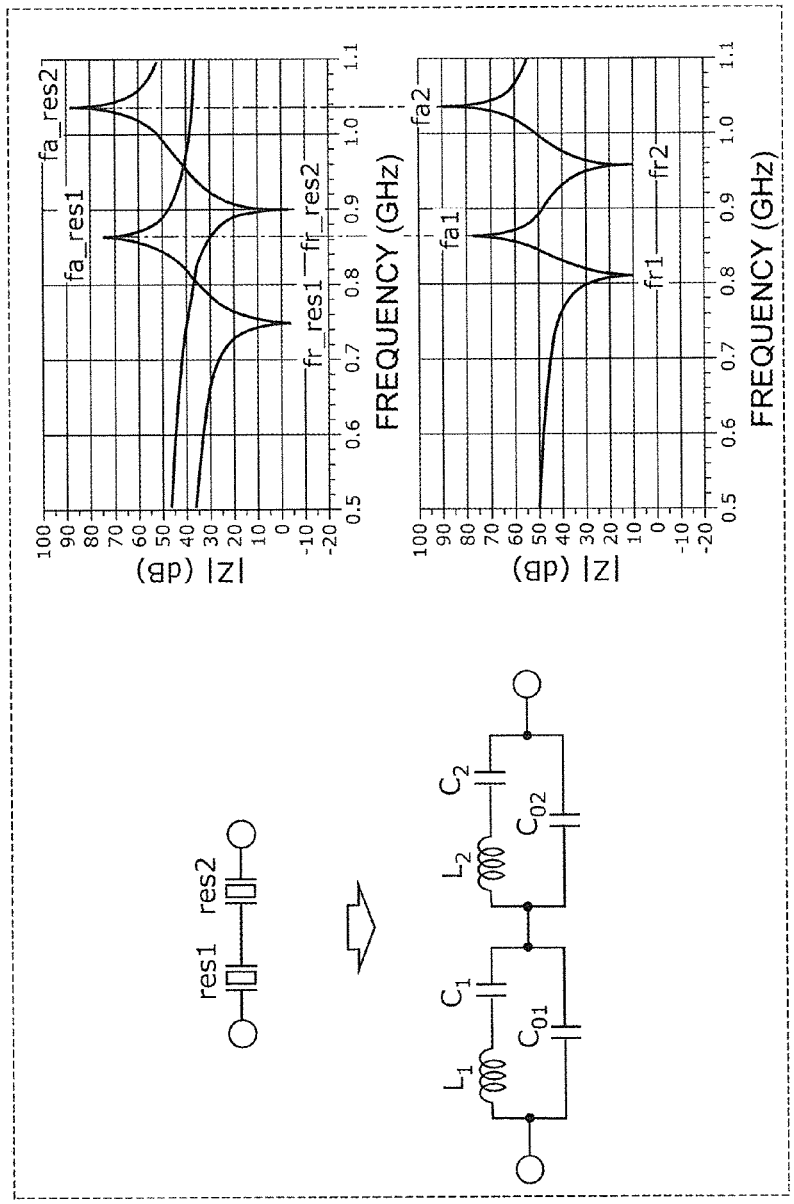
FIG. 8D shows an equivalent circuit model of two resonators connected in series and its resonant characteristics.

FIG. 8D shows an equivalent circuit model of two resonators connected in series and its resonant characteristics. The drawing shows a model in which resonators res1, res2 are connected in series with each other. The resonator res1 is represented by a circuit in which the capacitor $C_1$ and the inductor $L_1$ are connected in series and a circuit in which the capacitor $C_{01}$ is connected in parallel with the circuit in which the capacitor $C_1$ and the inductor $L_1$ are connected in series, as described above. The resonator res2 is represented by a circuit in which a capacitor $C_2$ and an inductor $L_2$ are connected in series and a circuit in which a capacitor $C_{02}$ is connected in parallel with the circuit in which the capacitor $C_2$ and the inductor $L_2$ are connected in series, as described above. The capacitors $C_{01}$, $C_{02}$ are respectively the electrostatic capacities of the resonators res1, res2. A circuit in which these resonators res1, res2 are connected in series is represented by an equivalent circuit shown at the lower left side of FIG. 8D. In other words, a circuit in which the resonator res1 and the resonator res2 are connected in series is represented by a series connected circuit of the circuit in which the capacitor $C_{01}$ is connected in parallel with the circuit connecting the capacitor $C_1$ and the inductor $L_1$ in series and the circuit in which the capacitor $C_{02}$ is connected in parallel with the circuit connecting the capacitor $C_2$ and the inductor $L_2$ in series.

In the equivalent circuit, the resonant frequency fr of the resonator is determined by the circuit in which the capacitor $C_1$ and the inductor $L_1$ are connected in series and is represented by the mathematical expression 1.

The resonant frequency of the equivalent circuit is a frequency at which the impedance Z of the equivalent circuit is zero, so it is found that the equivalent circuit has two resonant frequencies (fr1, fr2) as expressed by the mathematical expression 14 when the mathematical expression 13 is solved.

[Mathematical Expression 13]

$$Z = 0 = \frac{1}{\frac{1}{\frac{1}{j\omega C_{01}}} + \frac{1}{j\omega L_1 + \frac{1}{j\omega C_1}}} + \frac{1}{\frac{1}{\frac{1}{j\omega C_{02}}} + \frac{1}{j\omega L_2 + \frac{1}{j\omega C_2}}} \quad (13)$$

[Mathematical Expression 14]

$$f_r1 = \frac{\sqrt{\frac{-b - \sqrt{b^2 - 4ac}}{2a}}}{2\pi}$$

$$f_r2 = \frac{\sqrt{\frac{-b + \sqrt{b^2 - 4ac}}{2a}}}{2\pi} \quad (14)$$

$$a = C_{01} L_1 L_2 C_1 C_2 + C_{02} L_1 L_2 C_1 C_2$$
$$b = C_{01} L_2 C_2 - L_2 C_1 C_2 - C_{01} L_1 C_1 - C_{02} L_1 C_1 - L_1 C_1 C_2 - C_{02} L_2 C_2$$
$$c = C_{01} + C_1 + C_{02} + C_2$$

The resonant frequencies fr1, fr2 that are obtained from the mathematical expression 14 are different from the resonant frequencies (indicated as fr_res1, fr_res2 in the graph of FIG. 8D) of the resonators alone, which are obtained from the mathematical expression 1. The resonant frequency fr1 that is derived from the mathematical expression 13 is higher than the resonant frequency fr_res1 of the resonator res1 alone, and the resonant frequency fr2 is higher than the resonant frequency fr_res2 of the resonator res2 alone.

The anti-resonant frequency of the equivalent circuit is a frequency at which the admittance Y of the equivalent circuit is zero, so it is found that the equivalent circuit has two anti-resonant frequencies (fa1, fa2) as expressed by the mathematical expression 15.

[Mathematical Expression 15]

$$f_a1 = \frac{\sqrt{1 + \frac{C_1}{C_{01}}}}{2\pi \sqrt{L_1 C_1}} \quad f_a2 = \frac{\sqrt{1 + \frac{C_2}{C_{02}}}}{2\pi \sqrt{L_2 C_2}} \quad (15)$$

In other words, it is found that the two anti-resonant frequencies fa1, fa2 that are represented by the equivalent circuit are respectively substantially equal to the anti-resonant frequency fa_res1 of the resonator res2 and the anti-resonant frequency fa_res2 of the resonator res2.

1-4-5. Description of Characteristics Based on Resonance Analysis

Based on the above-described resonance analysis, it demonstrates that the resonant frequency or anti-resonant frequency of the parallel arm circuit changes in response to switching between the on state and off state of the switch SW in the above-described Example 1, Comparative Example 1, and Comparative Example 2.

In other words, for example, in Example 1, the relationship among the two resonant frequencies (frm1a_on, frm1b_on) and the two anti-resonant frequencies (fam1a_on, fam1a_on) when the switch SW is on is shown by the mathematical expression 10 and the mathematical expression 12. In Example 1, for the case where the switch SW is off, there are three resonant frequencies and three anti-resonant frequencies, and mathematical expressions in resonance analysis would be complicated, so the mathematical expressions are not derived. Specifically, the relationship among three resonant frequencies (frm1a_off, frm1b_off, frm1c_off) and three anti-resonant frequencies (fam1a_off, fam1b_off, fam1c_off) in this case can be described by using an equivalent circuit model in which one resonator is connected in parallel with a circuit in which two resonators are connected in series. Frequencies at which the impedance of the equivalent circuit model (equivalent circuit) is zero are resonant frequencies, and frequencies at which the admittance is zero are anti-resonant frequencies.

For example, in Comparative Example 1, the relationship between one resonant frequency (frm11a_on) and one anti-resonant frequency (fam11a_on) when the switch SW is on is shown by the mathematical expression 5 and the mathematical expression 6. Similarly, for example, in Comparative Example 2, the relationship between one resonant frequency (frm21a_on) and one anti-resonant frequency (fam21a_on) when the switch SW is on is also shown by the mathematical expression 5 and the mathematical expression 6.

For example, in Comparative Example 1, the relationship between one resonant frequency (frm11a_off) and one anti-resonant frequency (fam11a_off) when the switch SW is off is shown by the mathematical expression 8 and the mathematical expression 9.

For example, in Comparative Example 2, the relationship among two resonant frequencies (frm21a_off, frm21b_off) and two anti-resonant frequencies (fam21a_off, fam21b_off) when the switch SW is off is shown by the mathematical expression 14 and the mathematical expression 15.

1-5. Structure of Resonator

Each of the resonators (the series arm resonator s1 and the parallel arm resonators p1 to p3) that make up the filter 10 according to the present embodiment is an acoustic wave resonator using acoustic waves, and is, for example, a resonator that uses SAW (surface acoustic waves), a resonator that uses BAW (bulk acoustic waves), an FBAR (film bulk acoustic resonator), or the like. Not only surface acoustic waves but also boundary acoustic waves are included in SAW.

Hereinafter, the structure of each of the resonators that make up the filter 10 will be described by way of a resonator that uses SAW as an example.

1-5-1. Electrode Structure of Resonator

Figure 9A:
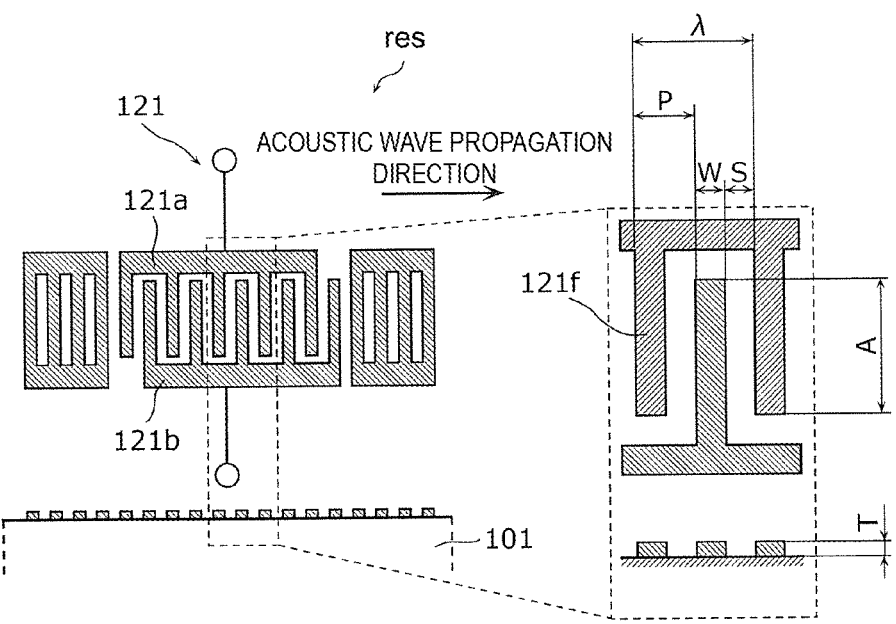
FIG. 9A shows a plan view and cross-sectional view of the electrode structure of each resonator in the first embodiment.
Figure 9B:
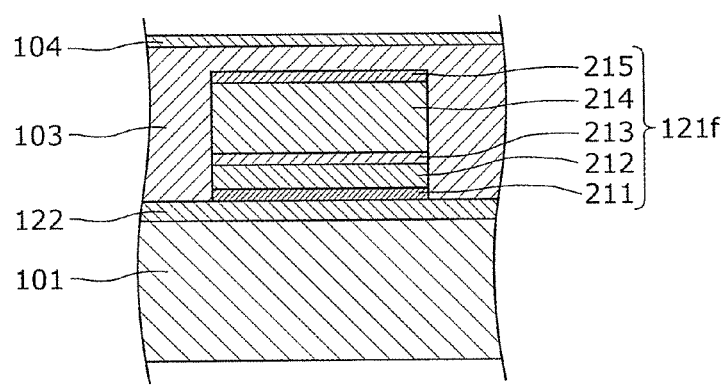
FIG. 9B is a cross-sectional view of an electrode finger of the resonator and its surrounding structure in the first embodiment.

FIG. 9A shows a plan view and cross-sectional view of the electrode structure of each resonator in the first embodiment. FIG. 9B is a cross-sectional view of an electrode finger of the resonator and its surrounding structure in the first embodiment. FIG. 9A and FIG. 9B respectively illustrate the schematic plan view and schematic cross-sectional view of the structure of a resonator res that corresponds to each of the resonators that make up the filter 10. The resonator res shown in FIG. 9A is the one for illustrating a typical structure of each of the resonators. The number, length, and the like, of electrode fingers that make up the electrode are not limited thereto.

As shown in FIG. 9A, the resonator res is an acoustic wave resonator having an interdigital transducer electrode 121 made up of a plurality of electrode fingers 121f formed on a piezoelectric substrate 101 at least partially having piezoelectricity. With this configuration, each of the resonators that make up the filter 10 is miniaturized, so miniaturization and cost reduction of the filter 10 are achieved. An acoustic wave resonator generally exhibits characteristics of high quality factor, so low loss and high selectivity of the filter 10 are achieved.

Specifically, as shown in FIG. 9A and FIG. 9B, the resonator res includes the piezoelectric substrate 101, a Ksaw adjusting film 122, a protective layer 103, and a protective layer 104 in addition to the interdigital transducer electrode 121. The piezoelectric substrate 101 at least partially has piezoelectricity.

The piezoelectric substrate 101 is made from lithium tantalate ($LiTaO_3$), lithium niobate ($LiNbO_3$), potassium niobate ($KNbO_3$), quartz crystal, or a multilayer body of some of these materials. With such a configuration, the resonator res that exhibits characteristics of high quality factor and wide band is provided.

The piezoelectric substrate 101 just needs to at least partially have piezoelectricity. For example, the piezoelectric substrate 101 may be made up of a multilayer body of a piezoelectric thin film (piezoelectric body) at its surface, a film having an acoustic velocity different from that of the piezoelectric thin film, a support substrate, and the like. The piezoelectric substrate 101 may be, for example, a multilayer body including a high acoustic velocity support substrate, and a piezoelectric thin film formed on the high acoustic velocity support substrate; a multilayer body including a high acoustic velocity support substrate, a low acoustic velocity film formed on the high acoustic velocity support substrate, and a piezoelectric thin film formed on the low acoustic velocity film; or a multilayer body including a support substrate, a high acoustic velocity film formed on the support substrate, a low acoustic velocity film formed on the high acoustic velocity film, and a piezoelectric thin film formed on the low acoustic velocity film. Alternatively, the piezoelectric substrate 101 may have piezoelectricity in the entire substrate. In this case, the piezoelectric substrate 101 is made up of one piezoelectric layer.

As shown in FIG. 9A, the interdigital transducer electrode 121 is made up of a pair of comb electrodes 121a, 121b facing each other. Each of the comb electrodes 121a, 121b has the plurality of electrode fingers 121f parallel to one another, and a busbar connecting the plurality of electrode fingers 121f. The plurality of electrode fingers 121f is formed along a direction perpendicular to the propagation direction. A reflector is provided on each side of the interdigital transducer electrode 121. The reflector may be formed with weights or the reflector need not be provided.

The interdigital transducer electrode 121 is made from a low-density metal layer or a multilayer body of a low-density metal layer and a high-density metal layer. The low-density metal layer is a metal layer made from a low-density metal that is one or more selected from among Al, Ti, Cu, Ag, Ni, Cr, and an alloy of these metals, or a multilayer body of some of these metal layers. The high-density metal layer is a metal layer made from a high-density metal that is one or more selected from among Au, Pt, Ta Mo, and W. The low-density metal is not limited to the above materials and just needs to be a metal having a lower density than the high-density metal from which the high-density metal layer is made.

For example, the interdigital transducer electrode 121 shown in FIG. 9B is formed such that, in order from the substrate 101 side, a metal film 211 made of NiCr, a metal film 212 made of Pt, a metal film 213 made of Ti, a metal film 214 made of AlCu (an alloy of Al and Cu), and a metal film 215 made of Ti are laminated. In other words, the interdigital transducer electrode 121 is made from a multilayer body of the four metal films 211, 212, 213, 214 that are low-density metal layers and the one metal film 215 that is a high-density metal layer.

The protective layer 103 and the protective layer 104 are protective layers that are intended to, for example, protect the interdigital transducer electrode 121 from an outside environment, adjust frequency-temperature characteristics, and enhance moisture resistance.

The Ksaw adjusting film 122 is formed between the piezoelectric substrate 101 and the interdigital transducer electrode 121. The Ksaw adjusting film 122 adjusts an electromechanical coupling coefficient.

These protective layers 103, 104 and Ksaw adjusting film 122 each are made from silicon oxide ($SiO_2$), silicon nitride (SiN), aluminum nitride (AlN), or a multilayer body of some of these materials. For example, the protective layer 103 and the Ksaw adjusting film 122 are made of $SiO_2$, and the protective layer 104 is made of SiN.

The configuration of the interdigital transducer electrode 121 shown in FIG. 9B is an example and is not limited thereto. As described above, the interdigital transducer electrode 121 may not have a multilayer structure of metal films but a monolayer of a metal film. The materials of the metal films and protective layers are not limited to the above-described materials. The interdigital transducer electrode 121 may be made of, for example, a metal, such as Ti, Al, Cu, Pt, Au, Ag, and Pd, or an alloy of the metal, or may be made up of a plurality of multilayer bodies made of the above-described metal or alloy. The configurations of the protective layers 103, 104 and Ksaw adjusting film 122 are not limited to the above-described configurations. The protective layers 103, 104 and the Ksaw adjusting film 122 each may be made of, for example, a dielectric or insulator such as SiO2, SiN, AlN, polyimide, and a multilayer body of some of these substances. The protective layers 103, 104 and the Ksaw adjusting film 122 need not be provided.

In the thus configured resonator res, the wave length of acoustic waves to be excited is determined by design parameters of the interdigital transducer electrode 121, or other parameters.

The wave length of acoustic waves is determined by a cycle period λ of the electrode fingers 121f connected to one busbar electrode among the plurality of electrode fingers 121f. An electrode finger pitch (the pitch of the plurality of electrode fingers 121f, that is, an electrode finger period) P is a half of the cycle period λ. The electrode finger pitch is defined as P=(W+S) where the line width of each electrode finger 121f is W and the space width between any adjacent electrode fingers 121f is S. The overlap width A of the interdigital transducer electrode 121 is an electrode finger length by which the electrode fingers 121f connected to one of the pair of busbar electrodes and the electrode fingers 121f connected to the other one of the pair of busbar electrodes overlap with each other when viewed in the propagation direction of acoustic waves. An electrode duty (duty ratio) is the occupancy of the line widths of the plurality of electrode fingers 121f, and is the proportion of the line width to an added value of the line width of each of the plurality of electrode fingers 121f and the space width between any adjacent two of the plurality of electrode fingers 121f, that is, the electrode duty is defined as W/(W+S). In other words, the electrode duty is the ratio of the width of each of the plurality of electrode fingers 121f to the electrode finger pitch (the pitch of the plurality of electrode fingers 121f), that is, the electrode duty is defined as W/P. The number of pairs is the number of paired electrode fingers 121f, and is defined as ((Total number of electrode fingers 121f)−1)/2. The film thickness T of the interdigital transducer electrode 121 (that is, the film thickness of the plurality of electrode fingers 121f) is a total film thickness of the metal films 211 to 215. The electrostatic capacity $C_0$ of the resonator res is expressed by the following mathematical expression 16.

[Mathematical Expression 16]

$$\text{ELECTROSTATIC CAPACITY } C_0 = \frac{\varepsilon_0 \cdot \varepsilon_r \cdot \text{NUMBER OF PAIRS} \cdot \text{OVERLAP WIDTH}}{2 \cdot (1 - \text{ELECTRODE DUTY})} \quad (16)$$

$\varepsilon_0$ is the permittivity in a vacuum, and $\varepsilon_r$ is the permittivity of the piezoelectric substrate 101.

As for the design parameters of the interdigital transducer electrode 121, when the film thickness T increases and, as a result, a film thickness ratio (T/λ) that is the ratio of the film thickness T to the cycle period λ of the electrode fingers 121f increases, manufacturing variations of the electrode finger width W increase. Furthermore, when the film thickness ratio exceeds 20%, there is inconvenience that resist collapse occurs and film formation cannot be performed. When the film thickness T is reduced and, as a result, the film thickness ratio is reduced, there is inconvenience that manufacturing variations of the film thickness T increase and the quality factor of the resonator deteriorates. For this reason, the film thickness ratio needs to be brought within a predetermined range, and ordinarily the film thickness ratio is set to about 8% to 15%.

As described above, the resonant frequency (frp3) of the parallel arm resonator p3 is higher than any of the resonant frequency (frp1) of the parallel arm resonator p1 and the resonant frequency (frp2) of the parallel arm resonator p2 (frp1<frp3 and frp2<frp3). Therefore, when all the parallel arm resonators p1 to p3 are designed to have the same film thickness, the film thickness ratio of the parallel arm resonator p3 increases, with the result that there is a possibility that the plurality of electrode fingers 121f that make up the interdigital transducer electrode of the parallel arm resonator p3 is not formed. In other words, when all the parallel arm resonators p1 to p3 are designed to have the same film thickness, it is difficult to raise the resonant frequency of the parallel arm resonator p3 to a required frequency.

Thus, it is desirable that the film thickness of the plurality of electrode fingers that make up the interdigital transducer electrode of the parallel arm resonator p3 (hereinafter, referred to as the film thickness of the parallel arm resonator p3) be less than the film thickness of the plurality of electrode fingers that make up the interdigital transducer electrode of the parallel arm resonator p1 (hereinafter, referred to as the film thickness of the parallel arm resonator p1) or the film thickness of the plurality of electrode fingers that make up the interdigital transducer electrode of the parallel arm resonator p2 (hereinafter, referred to as the film thickness of the parallel arm resonator p2). The film thickness of the parallel arm resonator p3 just needs to be less than the film thickness of at least one of the parallel arm resonators p1, p2 and may be greater than the film thickness of any one of the parallel arm resonators p1, p2.

With this configuration, the resonant frequency of the parallel arm resonator p3 is raised, so the frequency of the attenuation pole on the higher side of the pass band, which is provided by the resonant frequency when the switch SW is off, is raised. Thus, on the higher side of the pass band, an attenuation is ensured even at a frequency relatively far from the pass band.

In a resonator (acoustic wave resonator), the quality factor varies depending on the film thickness of a plurality of electrode fingers that make up an interdigital transducer electrode, and the quality factor is maximum when the ratio of the film thickness to the wave length of surface acoustic waves is at a certain point between 5% and 10%. Thus, when the film thickness of the parallel arm resonator p3 is made less than the film thickness of at least one of the parallel arm resonators p1, p2, both the parallel arm resonator p3 and the at least one of the resonators exhibit characteristics of high quality factor. Thus, further low loss and high selectivity of the filter 10 are achieved.

In each of the resonators (the series arm resonator s1, and the parallel arm resonators p1 to p3), the film thickness is not always uniform, and may not be uniform because of variations due to manufacturing process, or the like, or may not be uniform for the purpose of adjusting characteristics, or others. Therefore, the parallel arm resonator p3 and the parallel arm resonators p1, p2 may not satisfy the above-described relationship in film thickness. In other words, the above-described relationship in film thickness just needs to be substantially satisfied. For example, the relationship in film thickness just needs to be satisfied in any one of the relationship between the mean value of the parallel arm resonator p3 and the mean value of the parallel arm resonator p1 and the relationship between the mean value of the parallel arm resonator p3 and the mean value of the parallel arm resonator p2.

The frequency relationship between the resonant frequency (frp1) and anti-resonant frequency (fap1) of the parallel arm resonator p1 and the resonant frequency (frp2) and anti-resonant frequency (fap2) of the parallel arm resonator p2 is not specifically limited. The frequency relationship may be a frequency relationship (frp1<frp2 and fap1<fap2) similar to Example 1 or may be a frequency relationship (frp2<frp1 and fap2<fap1) similar to Example 2 (described later).

The thus configured filter 10 is suitable as a filter that has a low center frequency of a pass band and that is a component of a multiplexer using one of input/output terminals of a plurality of filters as a common terminal directly or via a signal phase shifter or a switch element. Specifically, in a multiplexer, when the anti-resonant frequency of the parallel arm resonator p3 lies within the pass band of another filter, a loss in the pass band of the another filter deteriorates. Thus, when the resonant frequency of the parallel arm resonator p3 is raised, the anti-resonant frequency of the parallel arm resonator p3 can be brought to the outside of the pass band of another filter, so a loss in the pass band of the another filter is reduced. In other words, the filter 10 can be used as a lower frequency-side filter that is a component of a multiplexer having a large difference between center frequencies of pass bands.

1-5-2. Influence of Film Thickness of High-Density Metal Layer on Characteristics Next, the relationship between the film thickness of the high-density metal layer and the characteristics of the resonator res will be described.

Figure 10:
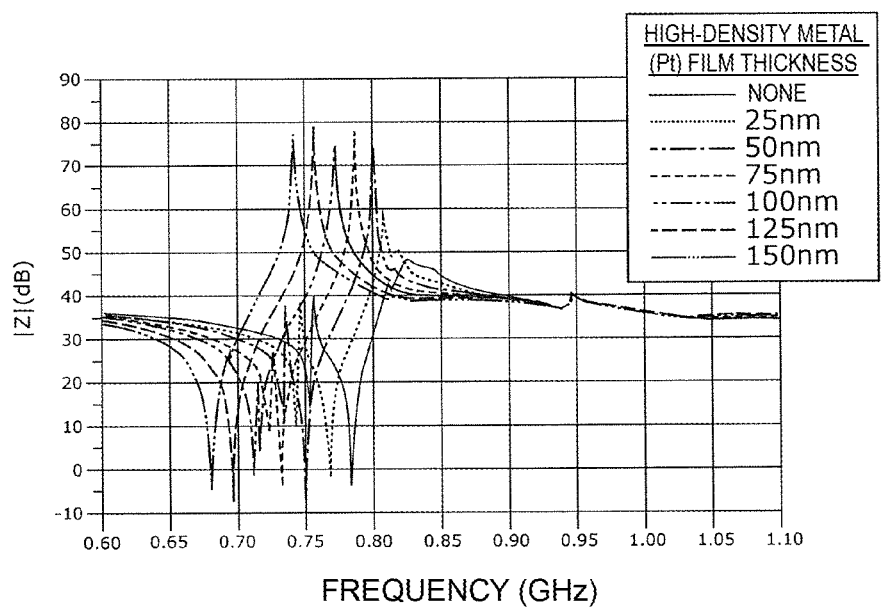
FIG. 10 is a graph that shows the relationship between the film thickness of a high-density metal layer and the impedance characteristics of the resonator.

FIG. 10 is a graph that shows the relationship between the film thickness of the high-density metal layer and the impedance characteristics of the resonator res. Specifically, the graph shows the impedance characteristics of the resonator res alone when the film thickness of the high-density metal layer made of Pt is varied by using Love waves as an example. The cross-sectional structure of the interdigital transducer electrode 121 at this time is as shown in FIG. 9B. Table 1 shows design parameters. At this time, the other design parameters such as electrode finger pitch are constant.

TABLE 1

| | Protective Layer 104 (SiN) | 40 nm |
|---|---|---|
| | Protective Layer 103 (SiO$_2$) | 1000 nm |
| Interdigital Transducer Electrode 121 (Electrode Fingers 121f) | Metal Film 215 (Low-Density Metal Layer Made of Ti) | 10 nm |
| | Metal Film 214 (Low-Density Metal Layer Made of AlCu) | 530 nm |
| | Metal Film 213 (Low-Density Metal Layer Made of Ti) | 50 nm |
| | Metal Film 212 (High-Density Metal Layer Made of Pt) | (See FIG. 10) |
| | Metal Film 211 (High-Density Metal Layer Made of NiCr) | 10 nm |
| | Ksaw Adjusting Film 122 | None |
| | Piezoelectric Substrate 101 | Cut Angle −10° LiNbO$_3$ |

As is apparent from FIG. 10, in the resonator res, as the film thickness of the high-density metal layer increases, the resonant frequency and the anti-resonant frequency shift to lower frequencies. However, the resonant frequency and anti-resonant frequency of the resonator res can be adjusted to the desired frequencies when the electrode finger pitch is adjusted as needed. Therefore, a shift of the resonant frequency and anti-resonant frequency resulting from changing the film thickness of the high-density metal layer does not matter.

However, as is apparent from the graph, when no high-density metal layer is provided or when the film thickness of the high-density metal layer is small (here, in the case of less than 125 nm), a resonant frequency and an anti-resonant frequency due to Rayleigh waves occur in addition to the resonant frequency and the anti-resonant frequency due to Love waves.

In this respect, the resonant frequency and anti-resonant frequency of the parallel arm resonator p1 due to Love waves and the resonant frequency and anti-resonant frequency of the parallel arm resonator p2 due to Love waves provide the pass band of the filter 10 or attenuation poles near the pass band. Therefore, when the resonant frequency and the anti-resonant frequency due to Rayleigh waves occur in the parallel arm resonators p1, p2, an unnecessary ripple can occur in the pass band of the filter 10 or in stop bands near the pass band.

Thus, to reduce occurrence of such unnecessary ripple, it is desirable that the plurality of electrode fingers of the parallel arm resonator p1 and the plurality of electrode fingers of the parallel arm resonator p2 include a high-density metal layer and, particularly, include a high-density metal layer having a film thickness to such a degree that occurrence of a resonant frequency and an anti-resonant frequency due to Rayleigh waves is reduced (here, greater than or equal to 125 nm).

On the other hand, the resonant frequency and anti-resonant frequency of the parallel arm resonator p3 are set on a higher frequency side than the pass band of the filter 10. For this reason, even when the resonant frequency and the anti-resonant frequency due to Rayleigh waves occur in the parallel arm resonator p3, the resonant frequency and the anti-resonant frequency substantially do not influence filter characteristics in the pass band of the filter 10 or filter characteristics near the pass band. Therefore, from the viewpoint of reducing an unnecessary ripple due to the Rayleigh waves, the film thickness of the high-density metal layer in the parallel arm resonator p3 is not constrained, and the parallel arm resonator p3 need not include the high-density metal layer.

As is apparent from the graph, when no high-density metal layer is provided or the film thickness of the high-density metal layer is small (here, in the case of less than 50 nm), the quality factor of the anti-resonant frequency is poor.

In this respect, the anti-resonant frequency (fap3) of the parallel arm resonator p3 is higher than any of the anti-resonant frequency (fap1) of the parallel arm resonator p1 and the anti-resonant frequency (fap2) of the parallel arm resonator p2 (fap1<fap3 and fap 2<fap3). Since the anti-resonant frequency of the parallel arm resonator p3 is a factor of deteriorating attenuation characteristics, attenuation characteristics are improved when the impedance is decreased by deteriorating the quality factor of the anti-resonant frequency. Even when the quality factor of the anti-resonant frequency of the parallel arm resonator p3 is poor, the poor quality factor almost does not influence characteristics in the pass band and in the stop bands near the pass band.

From the viewpoint of these filter characteristics and the above-described viewpoint of film formation of the plurality of electrode fingers, it is desirable that the plurality of electrode fingers of the parallel arm resonator p3 do not include a high-density metal layer or include a high-density metal layer less in film thickness than the high-density metal layer included in the plurality of electrode fingers of the parallel arm resonators p1, p2. The film thickness of the high-density metal layer in the parallel arm resonator p3 just needs to be less than the film thickness of the high-density metal layer of at least one of the parallel arm resonators p1, p2 and may be greater than the film thickness of the high-density metal layer of any one of the parallel arm resonators p1, p2.

As described above, when the electrode fingers of the parallel arm resonators p1, p2 include the high-density metal layer (here, desirably, the high-density metal layer having a film thickness of greater than or equal to 125 nm) and the electrode fingers of the parallel arm resonator p3 do not include the high-density metal layer or include a high-density metal layer less in film thickness than the high-density metal layers of the parallel arm resonators p1, p2, the resonant frequency of the parallel arm resonator p3 is raised while a ripple in filter characteristics in the pass band or in the stop bands near the pass band is reduced. Thus, the thus configured filter 10 is suitable as a lower frequency-side filter that is a component of a multiplexer.

It is desirable that the electrode fingers of the parallel arm resonators p1, p2 be made from a multilayer body of a high-density metal layer and a low-density metal layer.

That is, since a resonator having an interdigital transducer electrode made from a multilayer body of a high-density metal layer and a low-density metal layer is mainly able to decrease the acoustic velocity of SAW with the high-density metal layer, the size of the resonator can be reduced. The resonator also exhibits characteristics of high quality factor with the low-density metal layer made from a low-density metal having a lower resistance than a high-density metal. A ripple that is not necessary for filter characteristics, such as Rayleigh waves, is reduced. Therefore, when the electrode fingers of the parallel arm resonators p1, p2 have the above configuration, miniaturization, low loss, and high selectivity of the filter 10 are achieved. Only the electrode fingers of one of the parallel arm resonators p1, p2 may have the above configuration.

1-6. Other Characteristics (Example 2)

In Example 1, the case where the resonant frequency of the parallel arm resonator p1 is lower than the resonant frequency of the parallel arm resonator p2 (frp1<frp2) and the anti-resonant frequency of the parallel arm resonator p1 is lower than the anti-resonant frequency of the parallel arm resonator p2 (fap1<fap2) is described. However, the filter 10 according to the present embodiment is not limited thereto. Hereinafter, as another Example (Example 2) of the first embodiment, the case where the resonant frequency of the parallel arm resonator p1 is higher than the resonant frequency of the parallel arm resonator p2 (frp2<frp1) and the anti-resonant frequency of the parallel arm resonator p1 is higher than the anti-resonant frequency of the parallel arm resonator p2 (fap2<fap1) will be described.

In other words, in Example 1, of the parallel arm resonators p1, p2, the variable frequency circuit 12T is connected to the parallel arm resonator having a lower resonant frequency; however, this Example differs from Example 1 in that the variable frequency circuit 12T is connected to the parallel arm resonator having a higher resonant frequency.

Figure 11:
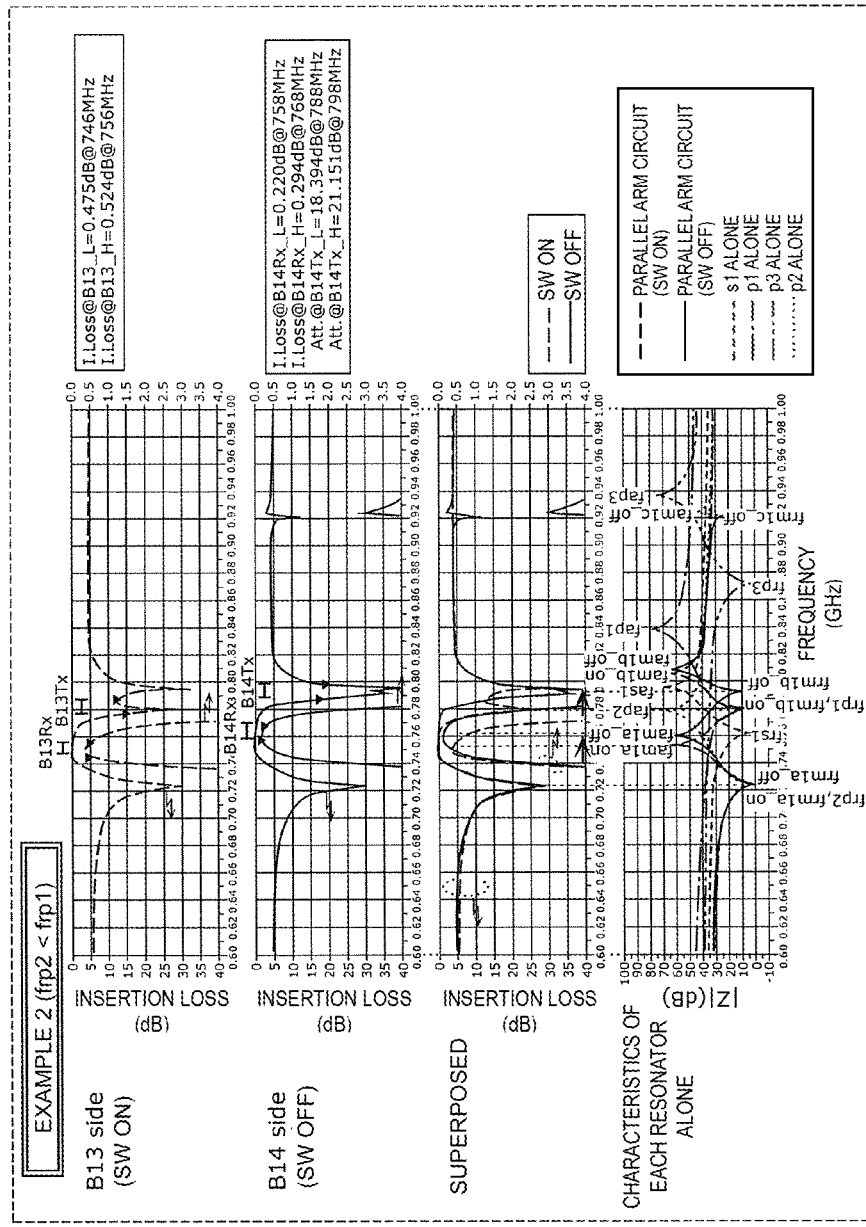
FIG. 11 shows graphs showing various characteristics of a filter according to another Example (Example 2) of the first embodiment.

FIG. 11 shows graphs showing various characteristics of a filter according to Example 2. Specifically, FIG. 11 shows, from the top, filter characteristics when the switch SW is on, filter characteristics when the switch SW is off, a combination of these two filter characteristics, and impedance characteristics of each of resonators alone and parallel arm circuit.

As shown by the filter characteristics in the graphs, the filter of this Example is a tunable receiving filter that changes the pass band between B13Rx (746 MHz to 756 MHz) that is the receiving band of Band 13 and B14Rx (758 MHz to 768 MHz) that is the receiving band of Band 14. When the pass band is changed to B13Rx, the stop band is changed to B13Tx (777 MHz to 787 MHz) that is the transmission band of Band 13. When the pass band is changed to B14Rx, the stop band is changed to B14Tx (788 MHz to 798 MHz) that is the transmission band of Band 14.

As shown by the impedance characteristics in the graph, in this Example, the resonant frequencies (frp1 to frp3) and anti-resonant frequencies (fap1 to fap3) of the parallel arm resonators p1 to p3 satisfy the following relationships.

frp2<frp1<frp3 fap2<fap1<fap3

First, when the switch SW is on, the parallel arm circuit 12 has two resonant frequencies (frm1a_on, frm1b_on) and two anti-resonant frequencies (fam1a_on, fam1b_on) that satisfy the following relationship.

frp2=frm1a_on<fam1a_on<frp1=frm1b_on<fam1b_on

This principle will be shown by the above-described mathematical expression 10 and mathematical expression 12.

On the other hand, when the switch SW is off, the parallel arm circuit 12 has three resonant frequencies (frm1a_off, frm1b_off, frm1c_off) and three anti-resonant frequencies (fam1a_off, fam1b_off, fam1c_off) that satisfy the following relationship.

frp2<frm1a_off<fam1a_off<frp1=frm1b_
off<fam1b_off<frm1c_off<fam1c_off

This principle will be described by using an equivalent circuit model in which one resonator is connected in parallel with a circuit in which two resonators are connected in series. The description of a specific example of the resonant frequencies and anti-resonant frequencies in this case is omitted; however, frequencies at which the impedance of the equivalent circuit model (equivalent circuit) is zero are resonant frequencies, and frequencies at which the admittance is zero are anti-resonant frequencies.

In this Example, as in the case of the above-described Example 1, a pass band is provided by the resonant frequency of the series arm circuit 11 and a first anti-resonant frequency that is the lowest frequency-side anti-resonant frequency of the parallel arm circuit 12, an attenuation pole on the lower side of the pass band is provided by a first resonant frequency that is the lowest frequency-side resonant frequency of the parallel arm circuit 12, and attenuation poles on the higher side of the pass band are provided by an anti-resonant frequency of the series arm circuit 11 and another resonant frequency of the parallel arm circuit 12.

In this respect, in this Example, as in the case of the above-described Example 1, the series arm circuit 11 is made up of only one series arm resonator s1, so the resonant frequency of the series arm circuit 11 is equal to the resonant frequency (frs1) of the series arm resonator s1, and the anti-resonant frequency of the series arm circuit 11 is equal to the anti-resonant frequency (fas1) of the series arm resonator s1. When the case where the switch SW is on and the case where the switch SW is off are compared with each other, it is found that the first anti-resonant frequency (fam1a_on in the case of the on state, fam1a_off in the case of the off state) that is the lowest frequency-side anti-resonant frequency of the parallel arm circuit 12 and the second resonant frequency (that is, the second lowest frequency-side resonant frequency; frm1b_on in the case of the on state, and frm1b_off in the case of the off state) next to the first resonant frequency that is the lowest frequency-side resonant frequency are changeable. In other words, in the parallel arm circuit 12 of this Example, both the first anti-resonant frequency and the second resonant frequency change toward a higher frequency side or a lower frequency side in response to switching between the on state and off state of the switch SW.

Therefore, in the filter of this Example, the frequency of the attenuation pole on the higher side of the pass band changes and the frequency at the higher edge of the pass band also changes in response to switching between the on state and off state of the switch SW. Specifically, both the frequency of the attenuation pole and the frequency at the higher edge of the pass band change toward a higher frequency side or a lower frequency side. Thus, in Example 2, the frequency of the attenuation pole on the higher side of the pass band can be changed while a loss at the higher edge of the pass band is reduced. Thus, the filter of this Example exhibits first filter characteristics having B13Rx as a pass band and B13Tx as a stop band when the switch SW is on and exhibits second filter characteristics having B14Rx as a pass band and B14Tx as a stop band when the switch SW is off.

Modification 1 of First Embodiment

Next, a filter according to Modification 1 of the first embodiment will be described.

2-1. Configuration

Figure 12:
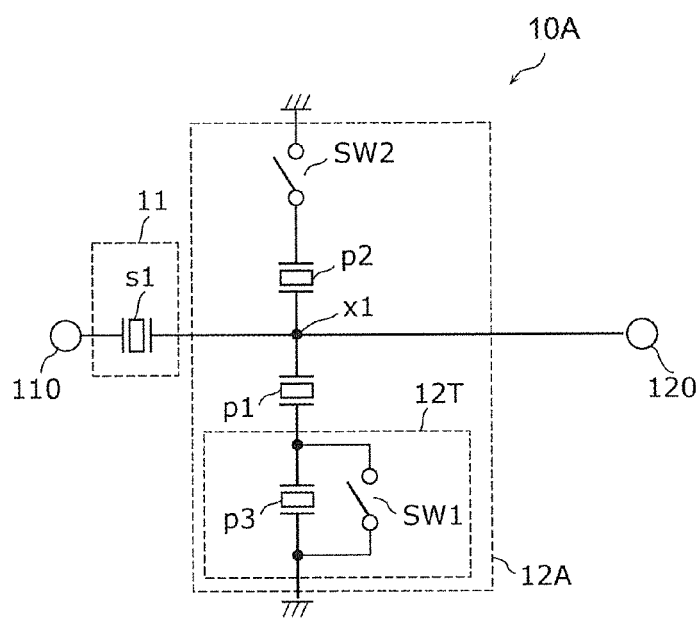
FIG. 12 is a circuit configuration diagram of a filter according to a first modification of the first embodiment.

FIG. 12 is a circuit configuration diagram of the filter 10A according to Modification 1 of the first embodiment.

As shown in the diagram, the filter 10A according to this Modification includes a parallel arm circuit 12A having a switch SW2, in place of the parallel arm circuit 12, as compared to the filter 10 according to the first embodiment. In other words, the parallel arm circuit 12A in this Modification, as compared to the parallel arm circuit 12, further includes the switch SW2 (second switch) connected in series with the parallel arm resonator p2 (second parallel arm resonator), and a circuit in which the parallel arm resonator p2 and the switch SW2 are connected in series is connected in parallel with a circuit in which the parallel arm resonator p1 (first parallel arm resonator) and the variable frequency circuit 12T (the first variable frequency circuit) are connected in series. The switch SW1 (first switch) shown in the diagram corresponds to the switch SW of the parallel arm circuit 12.

The switch SW2 is an SPST (single pole single throw) switch element connected in series with the parallel arm resonator p2 between the ground and the node x1 and is configured similarly to, for example, the switch SW1.

In this Modification, as for the parallel arm resonator p2 and the switch SW2, the parallel arm resonator p2 is connected on the series arm side, and the switch SW2 is connected on the ground side. Alternatively, the switch SW2 may be connected on the node x1 side, and the parallel arm resonator p2 may be connected on the ground side. However, when the parallel arm resonator p2 is formed on or in a chip for resonators together with the other resonators and the switch SW2 is formed on or in a chip different from the above chip, the number of terminals of the chip for resonators is reduced because the parallel arm resonator p2 is connected on the series arm side with respect to the switch SW2, so miniaturization can be achieved. When the switch SW2 is connected on the node x1 side with respect to the parallel arm resonator p2, the loss of the filter 10A can be deteriorated because of the resistive component (on resistance) of the switch SW2 when the switch SW2 is on. Therefore, from the viewpoint of miniaturization and loss reduction, it is desirable that the parallel arm resonator p2 be connected on the series arm side with respect to the switch SW2.

In the filter 10A configured as described above, when the switches SW1, SW2 are switched between the on state and the off state in accordance with a control signal from a control unit (not shown), such as an RFIC, the frequencies of the pass band and the frequencies of the attenuation poles are changed.

2-2. Characteristics (Example 3)

Next, the characteristics of the filter 10A according to this Modification will be described by way of Example (Example 3).

Hereinafter, as Example 3, the case where the resonant frequency of the parallel arm resonator p1 is lower than the resonant frequency of the parallel arm resonator p2 (frp1<frp2) and the anti-resonant frequency of the parallel arm resonator p1 is lower than the anti-resonant frequency of the parallel arm resonator p2 (fap1<fap2) will be described.

Figure 13:
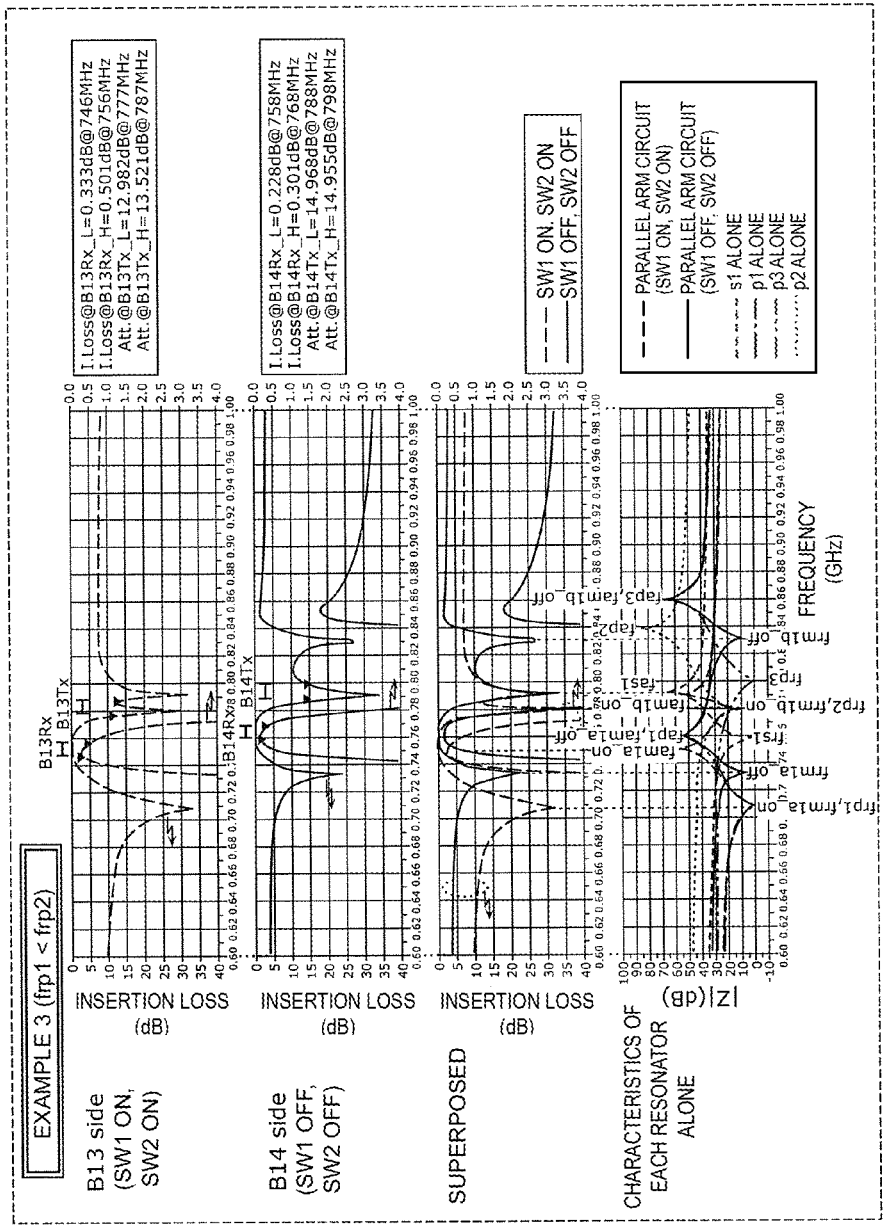
FIG. 13 shows graphs showing various characteristics of a filter according to Example (Example 3) that is the first modification of the first embodiment.

FIG. 13 shows graphs showing various characteristics of a filter according to Example 3. Specifically, the graphs show, from the top, filter characteristics when the switch SW1 is on and the switch SW2 is on (when both the switches SW1, SW2 are on), filter characteristics when the switch SW1 is off and the switch SW2 is off (when both the switches SW1, SW2 are off), a combination of these two filter characteristics, and impedance characteristics of each of the resonators alone and parallel arm circuit.

As shown by the filter characteristics in the graphs, the filter of this Example, as well as the filter of Example 2, is a tunable receiving filter that supports Bands 13, 14.

As shown by the impedance characteristics in the graph, in this Example, the resonant frequencies (frp1 to frp3) and anti-resonant frequencies (fap1 to fap3) of the parallel arm resonators p1 to p3 satisfy the following relationships.

frp1<frp2<frp3 fap1<fap2<fap3

First, when both the switches SW1, SW2 are on, the parallel arm resonator p3 is short-circuited by the switch SW1, and the parallel arm resonator p2 is connected to the ground by the switch SW2, so the parallel arm circuit 12A establishes a circuit in which the parallel arm resonator p1 and the parallel arm resonator p2 are connected in parallel. Thus, in this state, the parallel arm circuit 12A has two resonant frequencies (frm1a_on, frm1b_on) and two anti-resonant frequencies (fam1a_on, fam1b_on) that satisfy the following relationship.

frp1=frm1a_on<fam1a_on<frp2=frm1b_on<fam1b_on

This principle is similar to the principle when the switch SW is on in Example 1.

On the other hand, when both the switches SW1, SW2 are off, the parallel arm resonator p3 is enabled by the switch SW1, and the parallel arm resonator p2 is disabled (opened and does not function) by the switch SW2, so the parallel arm circuit 12A establishes a circuit in which the parallel arm resonator p1 and the parallel arm resonator p3 are connected in series. Thus, in this state, the parallel arm circuit 12A has two resonant frequencies (frm1a_off, frm1b_off) and two anti-resonant frequencies (fam1a_off, fam1b_off) that satisfy the following relationship.

frp1<frm1a_off<fap1=fam1a_off<frm1b_off<fam1b_off

This principle is similar to the principle when the switch SW is off in Comparative Example 2.

In this Example, a pass band is provided by the lower frequency-side anti-resonant frequency of the parallel arm circuit 12A and the resonant frequency of the series arm circuit 11, an attenuation pole on the lower side of the pass band is provided by the lower frequency-side resonant frequency of the parallel arm circuit 12A, and an attenuation pole on the higher side of the pass band is provided by the higher frequency-side resonant frequency of the parallel arm circuit 12A and the anti-resonant frequency of the series arm circuit 11.

In this respect, in this Example, as in the case of the above-described Example 1, the resonant frequency of the series arm circuit 11 is equal to the resonant frequency (frs1) of the series arm resonator s1, and the anti-resonant frequency of the series arm circuit 11 is equal to the anti-resonant frequency (fas1) of the series arm resonator s1. When the case where both the switches SW1, SW2 are on and the case where both the switches SW1, SW2 are off are compared with each other, it is found that the first resonant frequency (frm1a_on in the case of the on state, frm1a_off in the case of the off state) that is the lower frequency-side resonant frequency and the first anti-resonant frequency (fam1a_on in the case of the on state, fam1a_off in the case of the off state) that is the lower frequency-side anti-resonant frequency are changeable. When both the switches SW1, SW2 are off, a new second resonant frequency (frm1b_off) appears near the higher side of the pass band of the filter 10A. In other words, in the parallel arm circuit 12A, in response to switching between the on state and off state of each of the switches SW1, SW2, both the resonant frequency of the first resonant frequency and the first anti-resonant frequency change toward a higher frequency side or a lower frequency side, and the presence or absence of the second resonant frequency near the higher side of the pass band is switched.

Therefore, according to this Example, in response to switching between the on state and off state of each of the switches SW1, SW2, not only the frequency of the attenuation pole on the lower side of the pass band changes and the frequency at the lower edge of the pass band changes but also the frequency of the attenuation pole on the higher side of the pass band changes. Thus, the filter of this Example exhibits first filter characteristics having B13Rx as a pass band and B13Tx as a stop band when both the switches SW1, SW2 are on and exhibits second filter characteristics having B14Rx as a pass band and B14Tx as a stop band when both the switches SW1, SW2 are off.

In other words, according to Modification 1 of the first embodiment described by way of Example 3, as in the case of the first embodiment, in response to switching between the on state and off state of the switch SW1, the frequencies of the pass band and the frequency of the attenuation pole (in Example 3, the frequency at the lower edge of the pass band and the attenuation pole on the lower side of the pass band) can be changed while a loss at the edge of the pass band (the lower edge of the pass band in Example 3) is reduced. Furthermore, according to this Modification, in response to switching between the on state and off state of the switch SW2, a frequency change (frequency change on the higher side of the pass band in Example 3, that is, a change of the frequency at the higher edge of the pass band and the frequency of the attenuation pole on the higher side of the pass band) different from the frequency change (frequency change on the lower side of the pass band in Example 3) with the switch SW1 can be realized. In other words, in response to switching between the on state and off state of each of the switch SW1 and the switch SW2, any one of the frequency at the lower edge of the pass band, the frequency of the attenuation pole on the lower side of the pass band, the frequency at the higher edge of the pass band, and the frequency of the attenuation pole on the higher side of the pass band can be changed. Therefore, when the switches SW1, SW2 are switched between the on state and the off state at the same time, the center frequency can be changed.

2-3. Other Characteristics

In the filter 10A according to this Modification, the mode in which the switches SW1, SW2 are set to the on state at the same time or the switches SW1, SW2 are set to the off state at the same time is described as Example (Example 3); however, another mode may be selected. That is, the mode in which the switch SW1 is on and the switch SW2 is off and the mode in which the switch SW1 is off and the switch SW2 is on may be selected.

Figure 14:
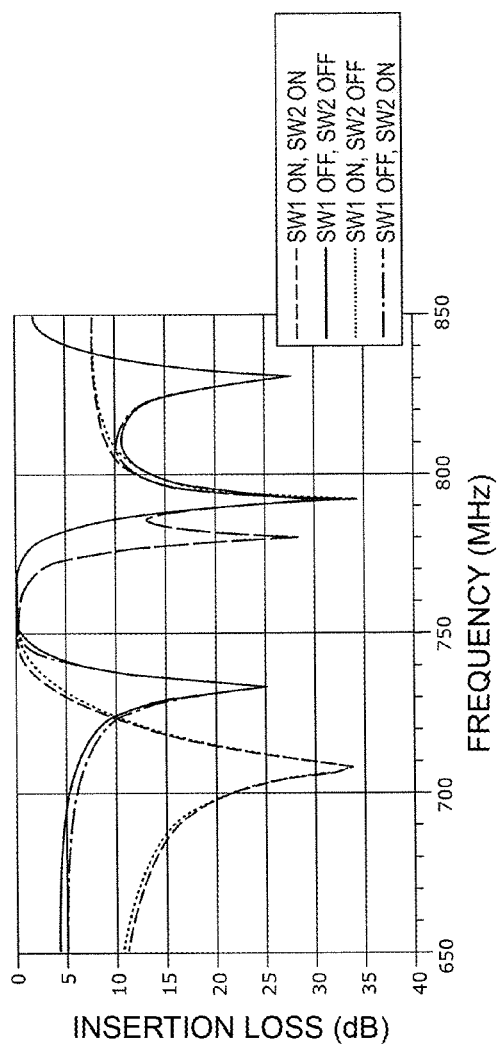
FIG. 14 shows a graph of changes in filter characteristics when switches are individually switched between an on state and an off state in the first modification of the first embodiment.

FIG. 14 shows a graph of changes in filter characteristics when the switches SW1, SW2 are individually switched between the on state and the off state in the filter 10A.

As shown in the graph, when the switch SW1 and the switch SW2 are individually switched between the on state and the off state, four filter characteristics are established. Specifically, the frequency at the lower edge of the pass band and the frequency of the attenuation pole on the lower side of the pass band are changed in response to switching between the on state and off state of the switch SW1, and the frequency at the higher edge of the pass band and the frequency of the attenuation pole on the higher side of the pass band are changed in response to switching between the on state and off state of the switch SW2. In other words, when the switches SW1, SW2 are individually switched between the on state and the off state, the variations of the changeable frequencies of the pass band and attenuation poles are increased to four. Namely, by switching between the on state and off state of the switch SW1 and switching between the on state and off state of the switch SW2 independently of each other, (i) the frequency at the lower edge of the pass band and the frequency of the attenuation pole on the lower side of the pass band or (ii) the frequency at the higher edge of the pass band and the frequency of the attenuation pole on the higher side of the pass band can be changed independently of each other.

Modification 2 of First Embodiment

Next, a filter according to Modification 2 of the first embodiment will be described.

3-1. Configuration

Figure 15:
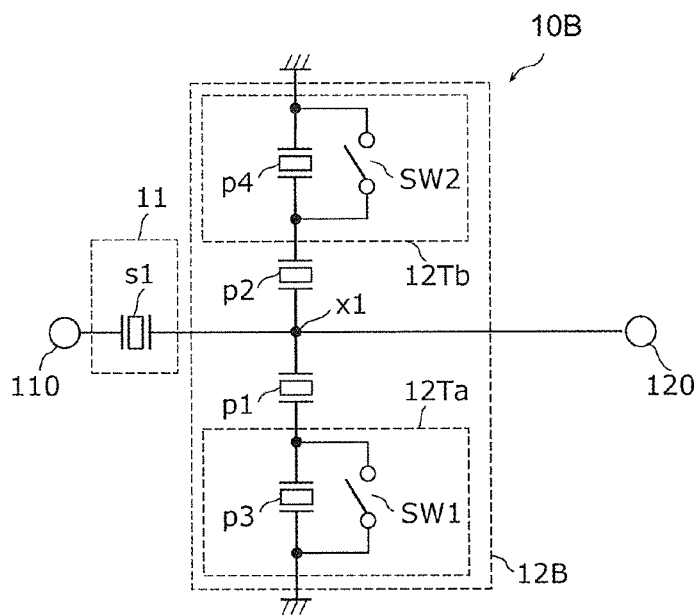
FIG. 15 is a circuit configuration diagram of a filter according to a second modification of the first embodiment.

FIG. 15 is a circuit configuration diagram of the filter 10B according to Modification 2 of the first embodiment.

As shown in the diagram, the filter 10B according to this Modification further includes a parallel arm circuit 12B having a parallel arm resonator p4 as compared to the parallel arm circuit 12A of the filter 10A according to Modification 1 of the first embodiment. In other words, the parallel arm circuit 12B in this Modification, as compared to the parallel arm circuit 12A, further includes the parallel arm resonator p4 (fourth parallel arm resonator) connected in parallel with the switch SW2 (second switch) and that makes up a variable frequency circuit 12Tb (second variable frequency circuit) together with the switch SW2. The variable frequency circuit 12Tb is connected in series with the parallel arm resonator p2 (second parallel arm resonator). The variable frequency circuit 12Tb changes the frequencies of the pass band of the filter 10B (radio-frequency filter) and the frequency of the attenuation pole of the filter 10B. A variable frequency circuit 12Ta (first variable frequency circuit) shown in the diagram corresponds to the variable frequency circuit 12T of the parallel arm circuit 12A.

In the thus configured parallel arm circuit 12B, the resonant frequencies and anti-resonant frequencies of the parallel arm resonators p1 to p4 satisfy the following fourth relationship in addition to the above-described first relationship (frp1≠frp2), second relationship (fap1≠fap2), and third relationship (frp1<frp3 and frp2<frp3).

In other words, the resonant frequency (frp4) of the parallel arm resonator p4 is higher than any of the resonant frequency (frp1) of the parallel arm resonator p1 and the resonant frequency (frp2) of the parallel arm resonator p2 (frp1<frp4 and frp2<frp4).

The parallel arm resonator p4, as well as the parallel arm resonators p1 to p3, has an anti-resonant frequency (fap4) on a higher frequency side than the resonant frequency (frp4). The parallel arm resonator p4, as well as the parallel arm resonators p1 to p3, is not limited to the configuration of only one resonator and may be made up of a plurality of resonators.

Even in the filter 10B configured as described above, as in the case of Modification 1 of the first embodiment, when the switches SW1, SW2 are switched between the on state and the off state in accordance with a control signal from a control unit (not shown), such as an RFIC, the frequencies of the pass band and the frequencies of the attenuation poles are changed.

3-2. Characteristics (Example 4)

Next, the characteristics of the filter 10B according to this Modification will be described by way of Example (Example 4).

Hereinafter, as Example 4, the case where the resonant frequency of the parallel arm resonator p1 is lower than the resonant frequency of the parallel arm resonator p2 (frp1<frp2) and the anti-resonant frequency of the parallel arm resonator p1 is lower than the anti-resonant frequency of the parallel arm resonator p2 (fap1<fap2) will be described.

Figure 16A:
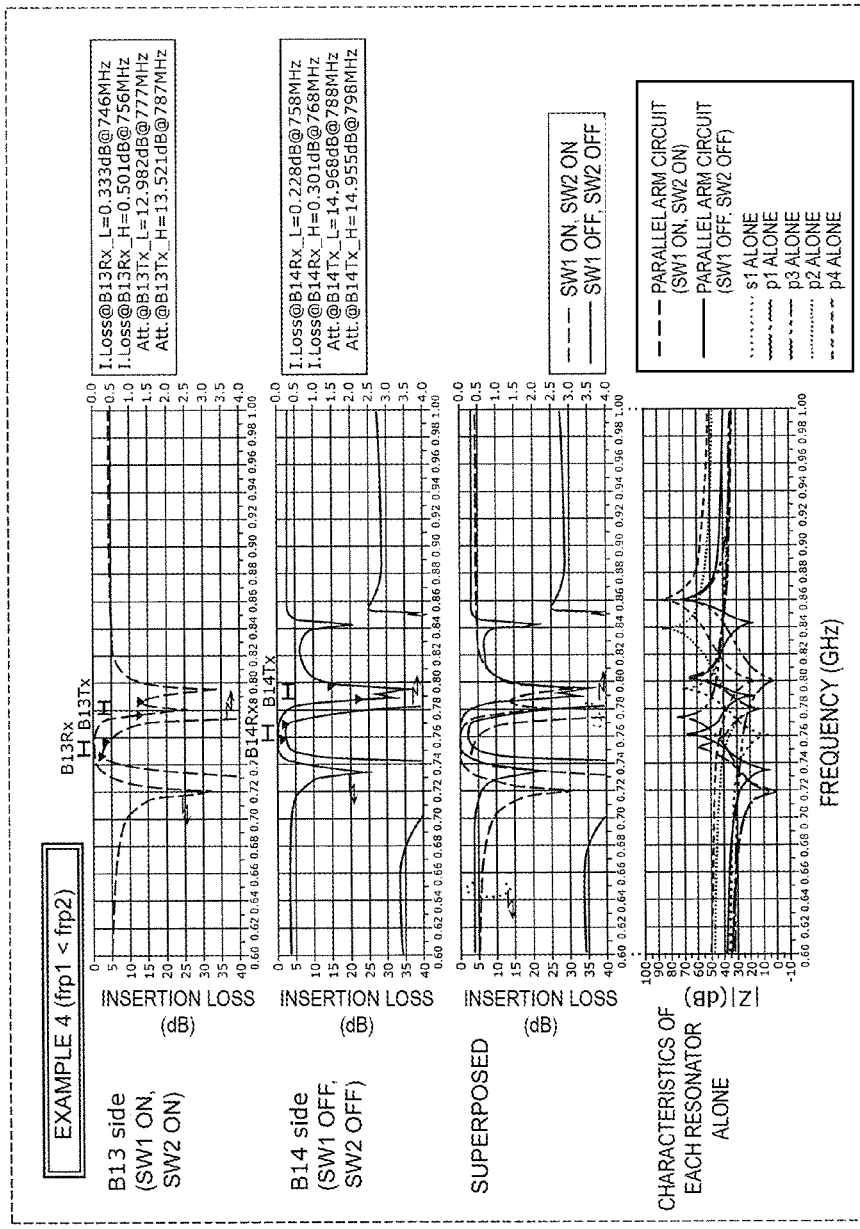
FIG. 16A shows graphs showing various characteristics of a filter according to Example (Example 4) that is the second modification of the first embodiment.
Figure 16B:
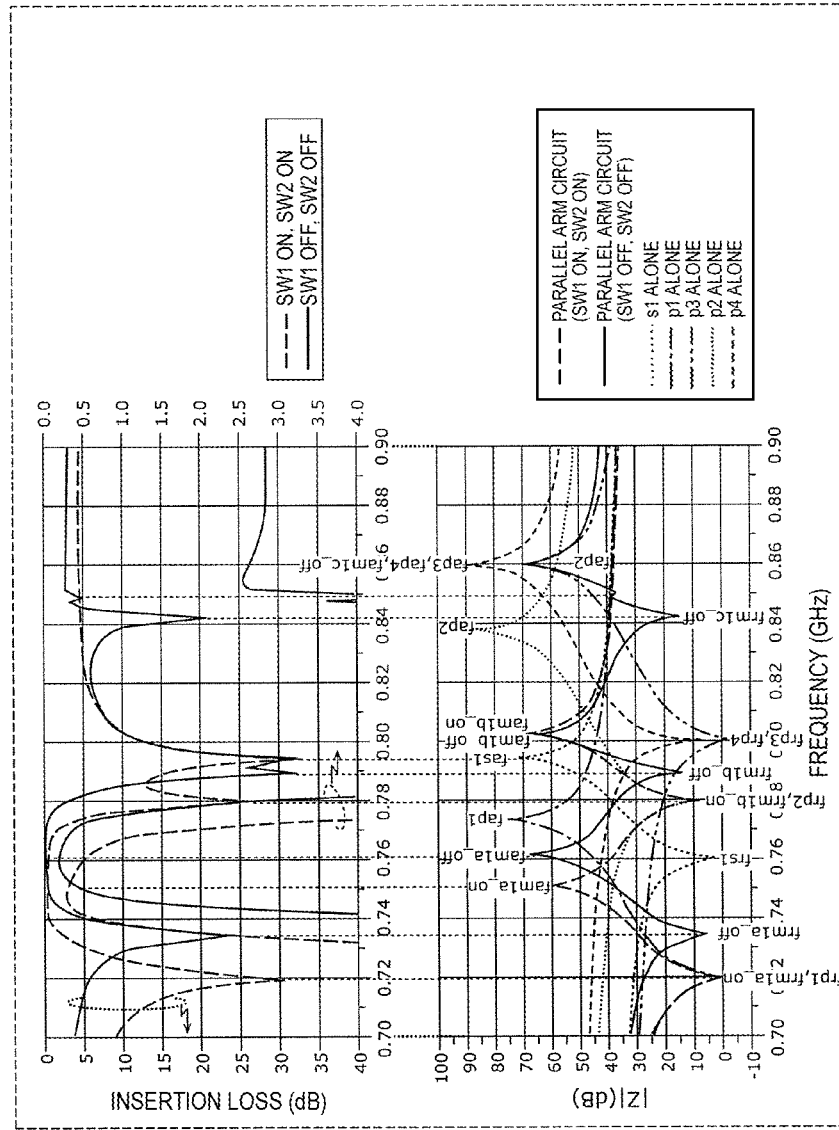
FIG. 16B shows graphs showing parts of FIG. 16A in a magnified view.

FIG. 16A shows graphs showing various characteristics of a filter according to Example 4. FIG. 16B shows graphs showing parts of FIG. 16A in a magnified view. Specifically, FIG. 16A shows, from the top, filter characteristics when the switch SW1 is on and the switch SW2 is on (when both the switches SW1, SW2 are on), filter characteristics when the switch SW1 is off and the switch SW2 is off (when both the switches SW1, SW2 are off), a combination of these two filter characteristics, and impedance characteristics of each of the resonators alone and parallel arm circuit alone. FIG. 16B shows filter characteristics and impedance characteristics in a pass band and near the pass band in a magnified view.

As shown by the filter characteristics in these graphs, the filter of this Example, as well as the filters of Examples 2, 3, is a tunable receiving filter that supports Bands 13, 14.

As shown by the impedance characteristics in the graph, in this Example, the resonant frequencies (frp1 to frp4) and anti-resonant frequencies (fap1 to fap4) of the parallel arm resonators p1 to p4 satisfy the following relationships.

frp1<frp2<frp3 frp1<frp2<frp4 fap1<fap2<fap3 fap1<fap2<fap4

In this Example, frp3=frp4, and fap3=fap4.

First, when both the switches SW1, SW2 are on, the parallel arm resonator p3 is short-circuited by the switch SW1, and the parallel arm resonator p4 is short-circuited by the switch SW2, so the parallel arm circuit 12B establishes a circuit in which the parallel arm resonator p1 and the parallel arm resonator p2 are connected in parallel. Thus, in this state, the parallel arm circuit 12B has two resonant frequencies (frm1$a$_on, frm1$b$_on) and two anti-resonant frequencies (fam1$a$_on, fam1$b$_on) that satisfy the following relationship.

frp1=frm1$a$_on<fam1$a$_on<frp2=frm1$b$_on<fam1$b$_on

This principle is similar to the principle when the switch SW is on in Example 1.

On the other hand, when both the switches SW1, SW2 are off, the parallel arm resonator p3 is enabled by the switch SW1, and the parallel arm resonator p4 is enabled by the switch SW2, so the parallel arm circuit 12B establishes a circuit in which a circuit connecting the parallel arm resonator p2 and the parallel arm resonator p4 in series is connected to a circuit connecting the parallel arm resonator p1 and the parallel arm resonator p3 in series. Thus, in this state, the parallel arm circuit 12B has three resonant frequencies (frm1$a$_off, frm1$b$_off, frm1$c$_off) and three anti-resonant frequencies (fam1$a$_off, fam1$b$_off, fam1$c$_off) that satisfy the following relationship.

frp1<frm1$a$_off<fam1$a$_off<fap2<frm1$b$_off<fam1$b$_off<frm1$c$_off<fam1$c$_off In this Example, frp3=frp4 and fap3=fap4, so the number of resonant frequencies and the number of anti-resonant frequencies each are three; however, when frp3≠frp4 and fap3≠fap4, the number of resonant frequencies and the number of anti-resonant frequencies each are four.

This principle will be described by using an equivalent circuit model in which a circuit connecting two resonators in series and a circuit connecting other two resonators in series are connected in parallel. The description of a specific example of the resonant frequencies and anti-resonant frequencies in this case is omitted; however, frequencies at which the impedance of the equivalent circuit model (equivalent circuit) is zero are resonant frequencies, and frequencies at which the admittance is zero are anti-resonant frequencies.

In this Example, a pass band is provided by the lowest frequency-side anti-resonant frequency of the parallel arm circuit 12B and the resonant frequency of the series arm circuit 11, an attenuation pole on the lower side of the pass band is provided by the lowest frequency-side resonant frequency of the parallel arm circuit 12B, and attenuation poles on the higher side of the pass band are provided by the other resonant frequency of the parallel arm circuit 12B and the anti-resonant frequency of the series arm circuit 11.

In this respect, in this Example, as in the case of the above-described Examples 1, 3, the resonant frequency of the series arm circuit 11 is equal to the resonant frequency (frs1) of the series arm resonator s1, and the anti-resonant frequency of the series arm circuit 11 is equal to the anti-resonant frequency (fas1) of the series arm resonator s1. When the case where both the switches SW1, SW2 are on and the case where both the switches SW1, SW2 are off are compared with each other, it is found that the first resonant frequency (frm1$a$_on in the case of the on state, frm1$a$_off in the case of the off state) that is the lowest frequency-side resonant frequency of the parallel arm circuit 12B and the first anti-resonant frequency (fam1$a$_on in the case of the on state, fam1$a$_off in the case of the off state) that is the lowest frequency-side anti-resonant frequency are changeable. In addition, it is found that the second resonant frequency (that is, the second resonant frequency from the lower frequency side; frm1$b$_on in the case of the on state, and frm1$b$_off in the case of the off state) next to the first resonant frequency are changeable. In other words, in the parallel arm circuit 12B of this Example, in response to switching between the on state and off state of each of the switches SW1, SW2, not only the first resonant frequency and the first anti-resonant frequency but also the second resonant frequency changes toward a higher frequency side or a lower frequency side.

Therefore, according to this Example, in response to switching between the on state and off state of each of the switches SW1, SW2, not only the frequency of the attenuation pole on the lower side of the pass band changes and the frequency at the lower edge of the pass band changes but also the frequency at the higher edge of the pass band and the frequency of the attenuation pole on the higher side of the pass band change. Thus, the filter of this Example exhibits first filter characteristics having B13Rx as a pass band and B13Tx as a stop band when both the switches SW1, SW2 are on and exhibits second filter characteristics having B14Rx as a pass band and B14Tx as a stop band when both the switches SW1, SW2 are off.

In other words, according to Modification 2 of the first embodiment described by way of Example 4, as in the case of the first embodiment, in response to switching between the on state and off state of the switch SW1, the frequencies of the pass band and the frequency of the attenuation pole (in Example 4, the frequency at the lower edge of the pass band and the attenuation pole on the lower side of the pass band) can be changed while a loss at the edge of the pass band (the lower edge of the pass band in Example 4) is reduced. Furthermore, according to this Modification, as in the case of Modification 1 of the first embodiment, in response to switching between the on state and off state of the switch SW2, a frequency change (frequency change on the higher side of the pass band in Example 4, that is, a change of the frequency at the higher edge of the pass band and the frequency of the attenuation pole on the higher side of the pass band) different from the frequency change (frequency change on the lower side of the pass band in Example 4) with the switch SW1 can be realized. Therefore, when the switches SW1, SW2 are switched between the on state and the off state at the same time, the center frequency can be changed.

In this respect, according to Example (Example 4) of Modification 2 of the first embodiment, the variable frequency width (fam1$a$_off−fam1$a$_on) of the first resonant frequency, the variable frequency width (frm1$b$_off−frm1$b$_on) of the first anti-resonant frequency, and the variable frequency width (frm1$b$_off−frm1$b$_on) of the second resonant frequency are equivalent.

In other words, according to Modification 2 of the first embodiment, the variable change width (variable frequency width) on the lower side of the pass band and the variable change width (variable frequency width) on the higher side of the pass band can be made equivalent to each other. Thus, the center frequency can be changed while the pass band width is maintained.

3-3. Other Characteristics

In the filter 10B according to this Modification, the mode in which the switches SW1, SW2 are set to the on state at the same time or the switches SW1, SW2 are set to the off state at the same time is described as Example (Example 4); however, another mode may be selected. That is, the mode in which the switch SW1 is on and the switch SW2 is off and the mode in which the switch SW1 is off and the switch SW2 is on may be selected.

Figure 17:
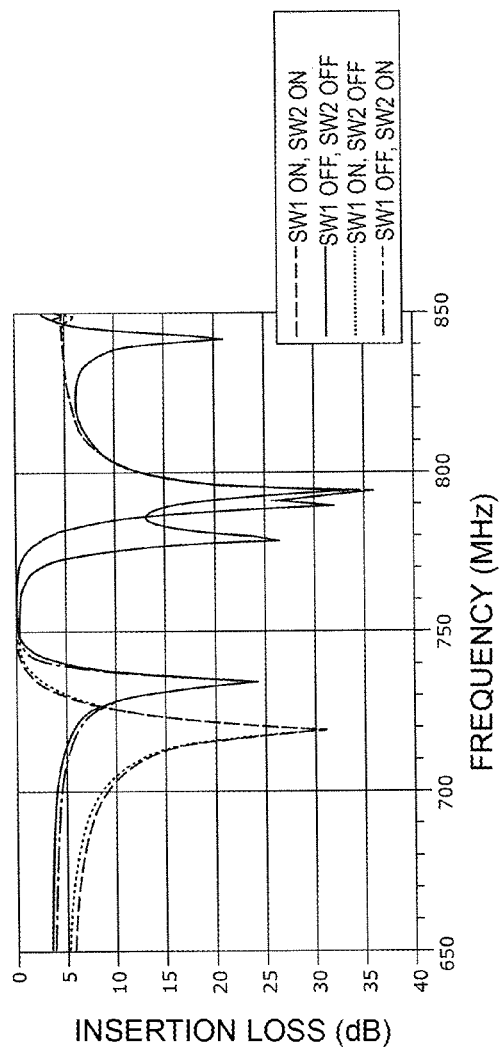
FIG. 17 shows a graph of changes in filter characteristics when switches are individually switched between an on state and an off state in the second modification of the first embodiment.

FIG. 17 shows a graph of changes in filter characteristics when the switches SW1, SW2 are changed between the on state and the off state in the filter 10B.

As shown in the graph, when the switch SW1 and the switch SW2 are individually switched between the on state and the off state, four filter characteristics are established. Specifically, the frequency at the lower edge of the pass band and the frequency of the attenuation pole on the lower side of the pass band are changed in response to switching between the on state and off state of the switch SW1, and the frequency at the higher edge of the pass band and the frequency of the attenuation pole on the higher side of the pass band are changed in response to switching between the on state and off state of the switch SW2. In other words, when the switches SW1, SW2 are individually switched between the on state and the off state, the variations of the changeable frequencies of the pass band and attenuation poles are increased to four.

Second Embodiment

The filters (radio-frequency filters) described in the first embodiment and its Modifications are applicable to a multiplexer. In the present embodiment, an example of the configuration in which such a multiplexer includes a tunable filter that supports Band 29Rx and Band 12+13Rx and a fixed frequency filter that supports Band 26Rx will be described.

4-1. Configuration

Figure 18:
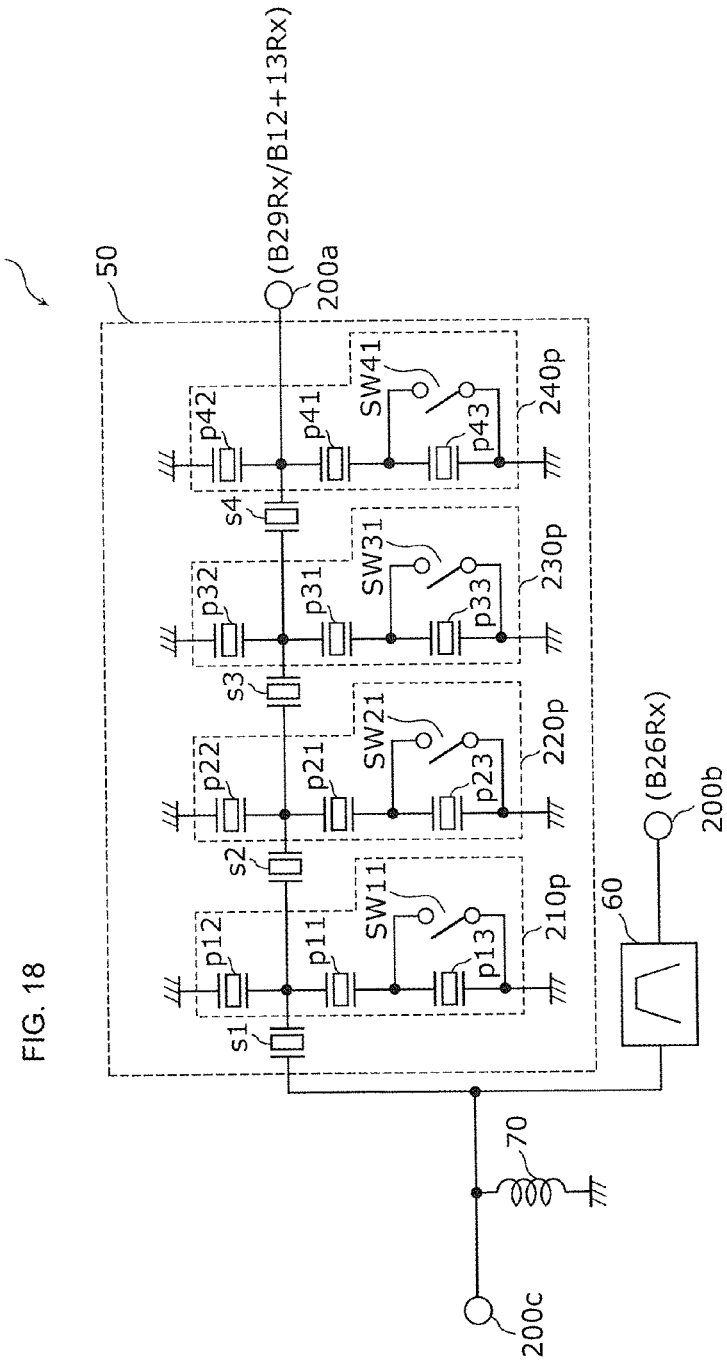
FIG. 18 is a circuit configuration diagram of a multiplexer (diplexer) according to a second embodiment.

FIG. 18 is a circuit configuration diagram of a multiplexer (diplexer) 200 according to a second embodiment. The multiplexer 200 shown in the diagram is a receiving multiplexer that supports Band 29Rx, Band 12+13Rx, and Band 26Rx. The multiplexer 200 includes a filter 50 (first filter), a filter 60 (second filter), and a matching inductor 70.

The multiplexer 200 is not limited to a receiving multiplexer. The multiplexer 200 may be a transmission multiplexer, a duplexer including a receiving filter and a transmission filter, or the like. The matching inductor 70 need not be provided. In the present embodiment, the filter 50 and the filter 60 are directly connected to a common terminal 200c. That is, in this Modification, the common terminal 200c-side input/output terminal (input terminal in this Modification) of the filter 50 and the common terminal 200c-side input/output terminal (input terminal in this Modification) of the filter 60 are directly connected to the common terminal 200c. Alternatively, these input/output terminals may be connected to the common terminal 200c via, for example, a phase shifter, a switch that is used to select at least one of the filter 50 and the filter 60, a circulator, or the like.

The filter 50 is a tunable receiving filter for Band 29Rx and Band 12+13Rx. One of the input/output terminals is connected to the common terminal 200c of the multiplexer 200, and the other one of the input/output terminals is connected to an input/output terminal 200a of the multiplexer 200. The filter 50 is a ladder filter circuit made up of one or more series arm circuits (four series arm circuits in the present embodiment) provided in a series arm and one or more parallel arm circuits (four parallel arm circuits 210p, 220p, 230p, 240p in the present embodiment). In the present embodiment, each series arm circuit is made up of one series arm resonator, and the four series arm circuits are made up of four series arm resonators s1 to s4. The number of the series arm circuits and the number of the parallel arm circuits are not limited to the above-described numbers.

Each of the parallel arm circuits 210p, 220p, 230p, 240p corresponds to the parallel arm circuit 12 of the filter 10 according to the first embodiment. The parallel arm circuits 210p, 220p, 230p, 240p respectively have parallel arm resonators p11, p21, p31, p41 corresponding to the parallel arm resonator p1 of the parallel arm circuit 12, parallel arm resonators p12, p22, p32, p42 corresponding to the parallel arm resonator p2 of the parallel arm circuit 12, parallel arm resonators p13, p23, p33, p43 corresponding to the parallel arm resonator p3 of the parallel arm circuit 12, and switches SW11, SW21, SW31, SW41 corresponding to the switch SW1 of the parallel arm circuit 12.

In the thus configured parallel arm circuit (parallel arm circuits 210p, 220p, 230p, 240p), the resonant frequencies and anti-resonant frequencies of the parallel arm resonators that correspond to the parallel arm resonators p1 to p3 of the parallel arm circuit 12 further satisfy the following fifth relationship in addition to the above-described first relationship (frp1≠frp2), second relationship (fap1≠fap2), and third relationship (frp1<frp3 and frp2<frp3).

In other words, the anti-resonant frequencies (fa13, fa23, fa33, fa43) of the parallel arm resonators p13, p23, p33, p43 (third parallel arm resonators) that correspond to the parallel arm resonator p3 of the parallel arm circuit 12 lie outside the pass band of the filter 60 (second filter). Namely, the anti-resonant frequencies of the parallel arm resonators p13, p23, p33, p43 lie on the lower frequency side than the pass band of the filter 60 or lie on the higher frequency side than the pass band of the filter 60.

It is desirable that the anti-resonant frequencies of all the parallel arm resonators p13, p23, p33, p43 lie outside the pass band of the filter 60 (second filter). Alternatively, the anti-resonant frequency of at least one of the parallel arm resonators p13, p23, p33, p43 just needs to lie outside the pass band of the filter 60 (second filter). Alternatively, part of the anti-resonant frequencies of the parallel arm resonators p13, p23, p33, p43 may lie on the lower frequency side than the pass band of the filter 60 and at least another part of the anti-resonant frequencies may lie on the higher frequency side than the pass band of the filter 60.

The thus-configured filter 50 has the configuration of the filter 10 according to the first embodiment, so the frequencies of the pass band and the frequency of the attenuation pole can be changed while a loss at the edge of the pass band is reduced.

The filter 60 is a receiving filter having no variable frequency function for Band 26Rx. One of the input/output terminals is connected to the common terminal 200c of the multiplexer 200, and the other one of the input/output terminals is connected to an input/output terminal 200b of the multiplexer 200. In the present embodiment, the center frequency of the pass band (here, the center frequency of Band 26Rx) of the first filter 60 (second filter) is higher than any of the center frequencies of the changeable pass bands (here, the center frequency of Band 29Rx and the center frequency of Band 12+13Rx) of the filter 50 (first filter).

The multiplexer 200 configured as described above can be used as a multiplexer that supports Band 29Rx and Band 26Rx and a multiplexer that supports Band 12+13Rx and Band 26Rx when the switches SW11, SW21, SW31, SW41 of the filter 50 are switched between an on state and an off state in accordance with a control signal from a control unit (not shown), such as an RFIC.

The tunable filter (the filter 50 in the present embodiment) is not limited to the configuration including the parallel arm circuit 12 of the first embodiment, and may have a configuration including the parallel arm circuit of any one of Modifications. For example, the configuration of the tunable filter can be determined as needed according to frequency specifications or others required for the multiplexer 200.

4-2. Characteristics (Example 5)

Next, the characteristics of the multiplexer 200 according to the present embodiment will be described by way of Example 5.

In Example 5, the case where, in each parallel arm circuit, the resonant frequency of the parallel arm resonator that corresponds to the parallel arm resonator p1 of the parallel arm circuit 12 is lower than the resonant frequency of the parallel arm resonator that corresponds to the parallel arm resonator p2 (frp1<frp2) and the anti-resonant frequency of the parallel arm resonator that corresponds to the parallel arm resonator p1 is lower than the anti-resonant frequency of the parallel arm resonator that corresponds to the parallel arm resonator p2 (fap1<fap2) will be described. In Example 5, in each parallel arm circuit, the resonant frequency of the parallel arm resonator that corresponds to the parallel arm resonator p3 of the parallel arm circuit 12 is 916 MHz and lies on the higher frequency side than the pass band (859 MHz to 894 MHz) of the filter 60.

Figure 19:
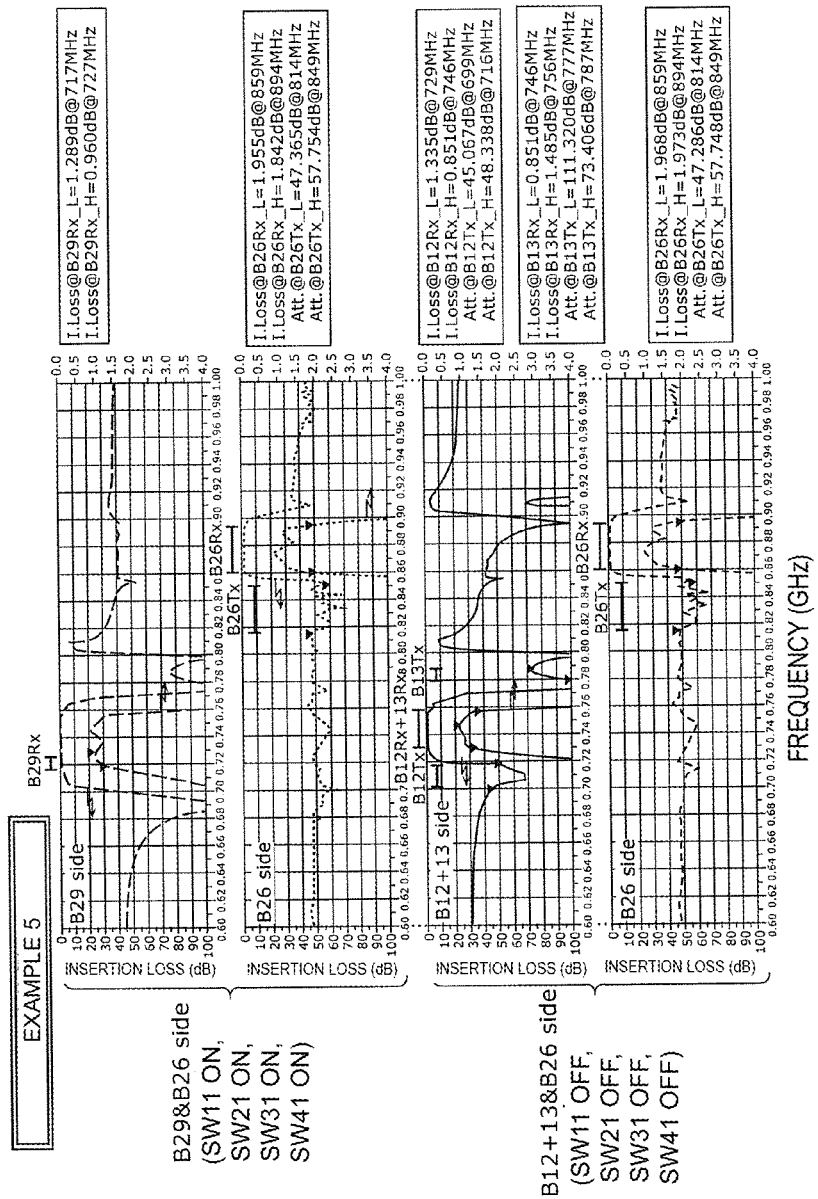
FIG. 19 shows graphs showing bandpass characteristics of a multiplexer according to Example (Example 5) of the second embodiment.

FIG. 19 shows graphs showing bandpass characteristics of the multiplexer according to Example 5. Specifically, the top graph shows bandpass characteristics when all the switches SW11, SW21, SW31, SW41 are on, and the bottom graph shows bandpass characteristics when all the switches SW11, SW21, SW31, SW41 are off. In any of the bandpass characteristics, an insertion loss of the path in which the filter 50 is provided is shown on the upper side, and an insertion loss of the path in which the filter 60 is provided is shown on the lower side.

As is apparent from the graphs, according to this Example, when all SW11, SW21, SW31, SW41 are on, the multiplexer supports Band 29Rx and Band 26Rx; when all SW11, SW21, SW31, SW41 are off, the multiplexer supports Band 12+13Rx and Band 26Rx.

4-3. Influence of Anti-Resonant Frequency of Third Parallel Arm Resonator on Characteristics Next, the influence of the anti-resonant frequencies (fa13, fa23, fa33, fa43) of the parallel arm resonators p13, p23, p33, p43 (third parallel arm resonators) on the characteristics of the multiplexer 200 will be described.

Figure 20:
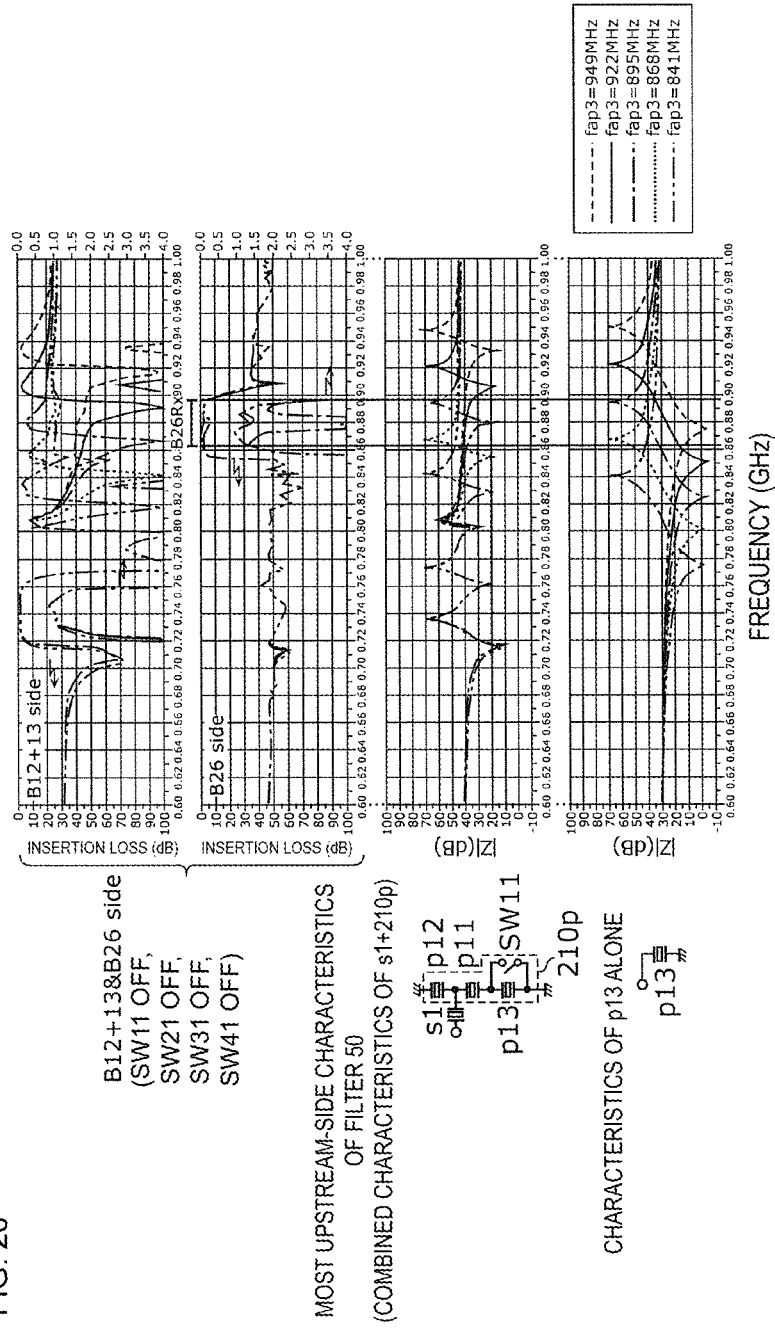
FIG. 20 shows graphs that shows the relationship between the anti-resonant frequencies of third parallel arm resonators and various characteristics of the multiplexer according to the second embodiment.

FIG. 20 shows graphs that show the relationship between the anti-resonant frequencies of the third parallel arm resonators and various characteristics of the multiplexer 200. Specifically, the graphs show bandpass characteristics in the case where all the switches SW11, SW21, SW31, SW41 are off, the impedance characteristics of the most upstream-side circuit made up of the parallel arm circuit 210p and the series arm resonator s1 connected closest to the common terminal 200c, and the impedance characteristics of the third parallel arm resonator (here, the parallel arm resonator p13) of the most upstream-side circuit when the anti-resonant frequencies (fap3) of the third parallel arm resonators are varied. The anti-resonant frequencies of the third parallel arm resonators (here, the parallel arm resonators p23, p33, p43) of the circuits other than the most upstream-side circuit are equal to the anti-resonant frequency of the third parallel arm resonator of the most upstream-side circuit, so the graphs do not show those anti-resonant frequencies.

As is apparent from the graphs, in the case where all the switches SW11, SW21, SW31, SW41 are off, when the anti-resonant frequency of the parallel arm resonator p13 varies, the highest frequency-side anti-resonant frequency and the highest frequency-side resonant frequency of the impedance characteristics provided by the series arm resonator and the parallel arm resonator (here, the most upstream-side circuit) change accordingly. It is found that, when at least one of the anti-resonant frequency and the resonant frequency lies in the pass band of the filter 60, a loss in the pass band of the filter 60 deteriorates. Specifically, when the anti-resonant frequency of the parallel arm resonator p13 is 895 MHz or 868 MHz, a loss in the pass band of the filter 60 has deteriorated. Particularly, in the case where the anti-resonant frequency of the parallel arm resonator p13 is 895 MHz, when the highest frequency-side resonant frequency of the most upstream-side circuit lies in the pass band of the filter 60, a small pole (so-called spike ripple) that is provided by the resonant frequency arises in the pass band of the filter 60. Therefore, in this case, a loss in the pass band of the filter 60 has remarkably deteriorated.

Thus, it is desirable that the anti-resonant frequency of the parallel arm resonator p13 lie outside the pass band of the filter 60. With this configuration, the anti-resonant frequency and resonant frequency of the most upstream-side circuit are difficult to lie in the pass band of the filter 60, so a loss in the pass band of the filter 60 is reduced. This is not limited to the anti-resonant frequency of the parallel arm resonator p13 and also applies to the other third parallel arm resonators (parallel arm resonators p23, p33, p43). In other words, when the anti-resonant frequencies of the third parallel arm resonators lie outside the pass band of the filter 60, a loss in the pass band of the filter 60 is reduced.

In the present embodiment, each of the parallel arm circuits 210p, 220p, 230p, 240p corresponds to the parallel arm circuit 12 of the filter 10 according to the first embodiment. Alternatively, these may have a configuration corresponding to the parallel arm circuit of Modification 1 of the first embodiment or Modification 2 of the first embodiment or may be a combination of them. Furthermore, at least one or more of the parallel arm circuits 210p, 220p, 230p, 240p just need to include a circuit corresponding to the variable frequency circuit 12T of the first embodiment, and the other parallel arm circuits need not include a circuit corresponding to the variable frequency circuit 12T. In other words, the other parallel arm circuits may be made up of only an acoustic wave resonator, may be made up of an LC resonant circuit, or may be made up of an impedance element, such as an inductance element and a capacitance element.

When each parallel arm circuit corresponds to the parallel arm circuit of Modification 2 of the first embodiment, it is desirable that both the anti-resonant frequency of the third parallel arm resonator (which corresponds to the parallel arm resonator p3 in Modification 2 of the first embodiment) and the anti-resonant frequency of the fourth parallel arm resonator (which corresponds to the parallel arm resonator p4 in Modification 2 of the first embodiment) lie outside the pass band of the filter 60 (second filter). Thus, a loss in the pass band of the filter 60 is reduced.

Third Embodiment

The filters described in the above first embodiment and its Modifications or the multiplexers described in the second embodiment are applicable to a radio-frequency front-end circuit that supports a system having many service bands. In the present embodiment, such a radio-frequency front-end circuit and a communication device will be described.

Figure 21:
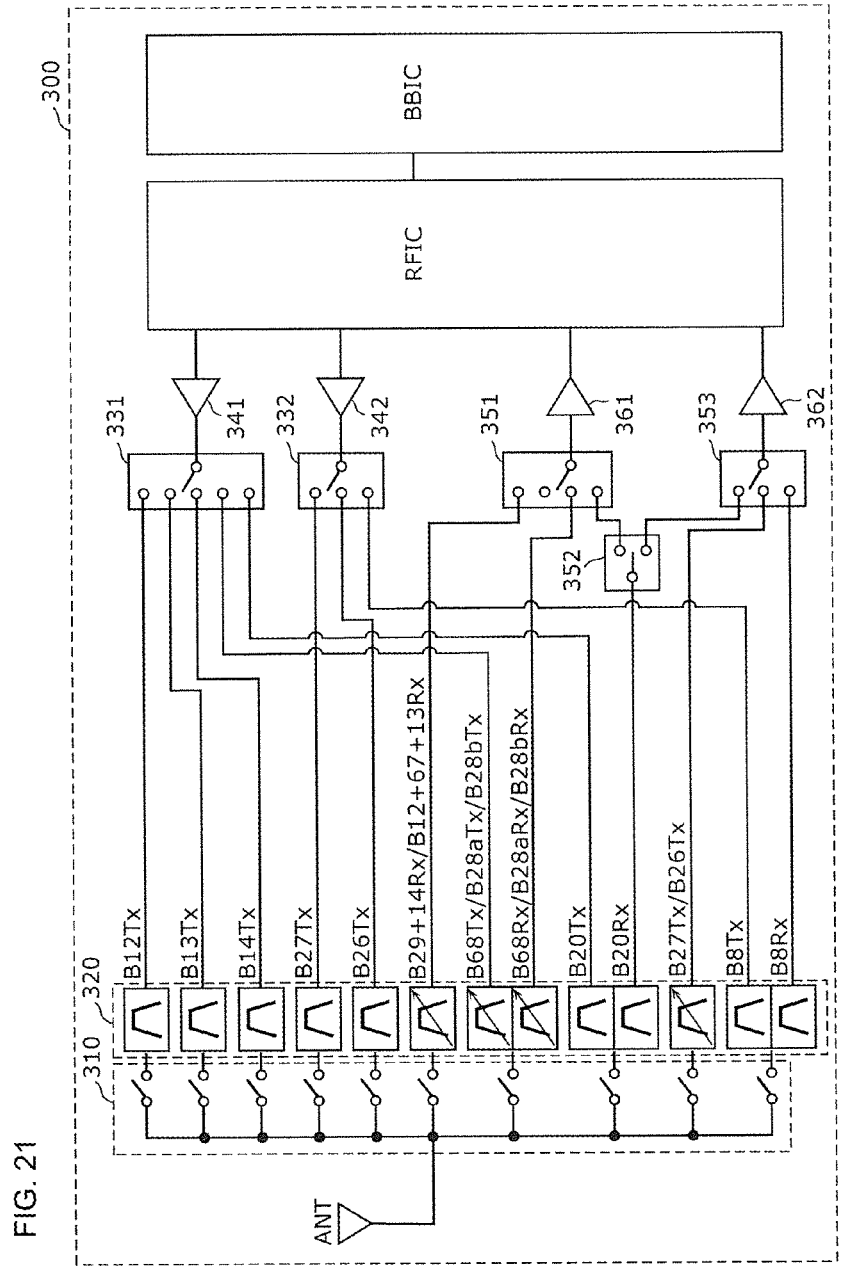
FIG. 21 is a configuration diagram of a communication device according to a third embodiment.

FIG. 21 is a configuration diagram of a communication device 300 according to a third embodiment.

As shown in the diagram, the communication device 300 includes an antenna element (ANT), a switch group 310 made up of a plurality of switches, a filter group 320 made up of a plurality of filters, transmission switches 331, 332, receiving switches 351, 352, 353, transmission amplifier circuits 341, 342, receiving amplifier circuits 361, 362, an RF signal processing circuit (RFIC), and a baseband signal processing circuit (BBIC).

The antenna element (ANT) is an antenna that supports multiband functionality compliant with communication standards, such as LTE, and that transmits or receives radio-frequency signals. The antenna element (ANT), for example, does not need to support all the bands of the communication device 300, and may support only a band of a lower-frequency band group or a higher-frequency band group. The antenna element (ANT) need not be incorporated in the communication device 300 and may be provided separately from the communication device 300.

The switch group 310 connects the antenna element (ANT) to a signal path that supports a predetermined band in accordance with a control signal from a control unit (not shown). The switch group 310 is made up of, for example, a plurality of SPST switches. The signal path to be connected to the antenna element (ANT) is not limited to one and may be multiple. That is, the communication device 300 may support carrier aggregation.

The filter group 320 is, for example, made up of a plurality of filters (including a duplexer) having the following bands as pass bands. Specifically, the bands include (i) a transmission band of Band 12, (ii) a transmission band of Band 13, (iii) a transmission band of Band 14, (iv) a transmission band of Band 27, (v) a transmission band of Band 26, (vi) a receiving band of Band 29 and Band 14 or a receiving band of Band 12, Band 67, and Band 13, (vii-Tx) a transmission band of Band 68, Band 28a, or Band 28b, (vii-Rx) a receiving band of Band 68, Band 28a, or Band 28b, (viii-Tx) a transmission band of Band 20, (viii-Rx) a receiving band of Band 20, (ix-Tx) a transmission band of Band 27 or Band 26, (x-Tx) a transmission band of Band 8, and (x-Rx) a receiving band of Band 8.

The transmission switch 331 is a switch circuit that includes a plurality of selection terminals connected to a plurality of low-band transmission signal paths and a common terminal connected to the transmission amplifier circuit 341. The transmission switch 332 is a switch circuit that includes a plurality of selection terminals connected to a plurality of high-band transmission signal paths and a common terminal connected to the transmission amplifier circuit 342. These transmission switches 331, 332 are switch circuits that are provided upstream (here, upstream in the transmission signal paths) of the filter group 320 and whose connection statuses are switched in accordance with control signals from a control unit (not shown). Thus, radio-frequency signals (here, radio-frequency transmission signals) amplified by the transmission amplifier circuits 341, 342 are outputted to the antenna element (ANT) via the predetermined filters of the filter group 320.

The receiving switch 351 is a switch circuit that includes a plurality of selection terminals connected to a plurality of low-band reception signal paths and a common terminal connected to the receiving amplifier circuit 361. The receiving switch 352 is a switch circuit that includes a common terminal connected to a reception signal path of a predetermined band (here, Band 20) and two selection terminals connected to a common terminal of the receiving switch 352. The receiving switch 353 is a switch circuit that includes a plurality of selection terminals connected to a plurality of high-band reception signal paths and a common terminal connected to the receiving amplifier circuit 362. These receiving switches 351 to 353 are provided downstream (here, downstream in the reception signal paths) of the filter group 320 and whose connection statuses are switched in accordance with control signals from the control unit (not shown). Thus, radio-frequency signals (here, radio-frequency reception signals) inputted to the antenna element (ANT) are amplified by the receiving amplifier circuits 361, 362 via the predetermined filters of the filter group 320 and outputted to the RF signal processing circuit (RFIC). An RF signal processing circuit (RFIC) that supports a low band and an RF signal processing circuit (RFIC) that supports a high band may be individually provided.

The transmission amplifier circuit 341 is a power amplifier that amplifies the electric power of a low-band radio-frequency transmission signal. The transmission amplifier circuit 342 is a power amplifier that amplifies the electric power of a high-band radio-frequency transmission signal.

The receiving amplifier circuit 361 is a low-noise amplifier that amplifies the electric power of a low-band radio-frequency reception signal. The receiving amplifier circuit 362 is a low-noise amplifier that amplifies the electric power of a high-band radio-frequency reception signal.

The RF signal processing circuit (RFIC) is a circuit that processes a radio-frequency signal that is transmitted or received by the antenna element (ANT). Specifically, the RF signal processing circuit (RFIC) processes a radio-frequency signal (here, radio-frequency reception signal) inputted from the antenna element (ANT) via the reception signal path by down conversion, or the like, and outputs the processed and generated reception signal to the baseband signal processing circuit (BBIC). The RF signal processing circuit (RFIC) also processes a transmission signal inputted from the baseband signal processing circuit (BBIC) by up conversion, or the like, and outputs the processed and generated radio-frequency signal (here, radio-frequency transmission signal) to the transmission signal path.

The thus configured communication device 300 includes the radio-frequency filter according to any one of the first embodiment and its Modifications as at least one of a filter having (vi) a receiving band of Band 29 and Band 14 or a receiving band of Band 12, Band 67, and Band 13 as a pass band, a filter having (vii-Tx) a transmission band of Band 68, Band 28a, or Band 28b as a pass band, a filter having (vii-Rx) a receiving band of Band 68, Band 28a, or Band 28b as a pass band, and a filter having (ix-Tx) a transmission band of Band 27 or Band 26 as a pass band. That is, the filter changes the frequencies of the pass band and the frequencies of the attenuation poles in accordance with a control signal.

In the communication device 300, the switch group 310, the filter group 320, the transmission switches 331, 332, the receiving switches 351, 352, 353, the transmission amplifier circuits 341, 342, the receiving amplifier circuits 361, 362, and the control unit make up the radio-frequency front-end circuit.

Although the control unit is not shown in FIG. 21, the RF signal processing circuit (RFIC) may include the control unit or the control unit may make up a switch IC together with the switches that the control unit controls.

With the thus configured radio-frequency front-end circuit and communication device 300, since the filters according to the first embodiment and its Modifications are provided, a high-performance radio-frequency front-end circuit and communication device that are able to change the frequencies of the pass band and the frequencies of the stop band while reducing a loss in the pass band are implemented. The number of filters is reduced as compared to the case where a filter is provided for each band, so miniaturization can be achieved.

With the radio-frequency front-end circuit according to the present embodiment, the transmission switches 331, 332 and the receiving switches 351 to 353 (switch circuits) provided upstream or downstream of the filter group 320 (the plurality of radio-frequency filters) are provided. Thus, parts of signal paths through which a radio-frequency signal is transferred can be integrated. Thus, for example, the transmission amplifier circuits 341, 342 or the receiving amplifier circuits 361, 362 (amplifier circuits), each of which corresponds to a plurality of radio-frequency filters, can be integrated. Therefore, miniaturization and cost reduction of the radio-frequency front-end circuit are possible.

At least one of the transmission switches 331, 332 or at least one of the receiving switches 351 to 353 just needs to be provided. The number of the transmission switches 331, 332 and the number of the receiving switches 351 to 353 are not limited to the above-described numbers. For example, one transmission switch and one receiving switch may be provided. The number of the selection terminals, or the like, of the transmission switches or receiving switches is not limited to the present embodiment and may be two of each.

Other Embodiments, and Others

The filters (radio-frequency filters), multiplexer, radio-frequency front-end circuit, and communication device according to the embodiments of the present disclosure are described by way of the first to third embodiments and its Modifications; however, the radio-frequency filter, multiplexer, radio-frequency front-end circuit, and communication device of the present disclosure are not limited to the above-described embodiments. The present disclosure also encompasses other embodiments implemented by combining selected elements of the above-described embodiments, modifications obtained by applying various alterations that are conceived of by persons skilled in the art to the above-described embodiments without departing from the purport of the present disclosure, and various devices that include the radio-frequency filter, multiplexer, radio-frequency front-end circuit, or communication device of the present disclosure.

The radio-frequency filters according to the first embodiment and its Modifications are not limited to application to a system that exclusively changes frequency bands close to one another and may also be applicable to a system that exclusively changes a plurality of channels close to one another and allocated to within one frequency band.

In the radio-frequency filters, multiplexer, radio-frequency front-end circuit, and communication device according to the first to third embodiments, an inductance element or a capacitance element may be further connected between terminals. An inductance component caused by wires that connect the circuit elements may be provided.

The present disclosure is widely usable in communication equipment, such as cellular phones, as a small radio-frequency filter, radio-frequency front-end circuit, and communication device that simultaneously or exclusively use a plurality of close bands and that are applicable to multiband and multimode systems.

10, 10A, 10B, 50, 60, 80, 90 filter
11 series arm circuit
12, 12A, 12B, 82, 92, 210p, 220p, 230p, 240p parallel arm circuit
12T, 12Ta, 12Tb, 82T variable frequency circuit
70 matching inductor
101 piezoelectric substrate
103, 104 protective layer
110, 120, 200a, 200b input/output terminal
121 interdigital transducer electrode
121a, 121b comb electrode
121f electrode finger
122 Ksaw adjusting film
200 multiplexer (diplexer)
200c common terminal
211 to 215 metal film
300 communication device
310 switch group
320 filter group
331, 332 transmission switch
341, 342 transmission amplifier circuit
351 to 353 receiving switch
361, 362 receiving amplifier circuit
p1 to p4, p11 to p13, p21 to p23, p31 to p33, p41 to p43 parallel arm resonator
res resonator
s1 to s4 series arm resonator
x1 node
SW, SW1, SW2, SW11, SW21, SW31, SW41 switch

The invention claimed is:

1. A radio-frequency filter comprising:
a series arm circuit disposed in a path, the path connecting a first input/output terminal and a second input/output terminal; and
a parallel arm circuit connected between ground and a node on the path, wherein:
the parallel arm circuit comprises:
a first parallel arm resonator,
a first variable frequency circuit connected in series with the first parallel arm resonator, and
a second parallel arm resonator connected in parallel with the first parallel arm resonator and with the first variable frequency circuit,
the first variable frequency circuit comprises:
a third parallel arm resonator, and
a first switch connected in parallel with the third parallel arm resonator,
the first variable frequency circuit is configured to change frequencies of a pass band of the radio-frequency filter and a frequency of an attenuation pole of the radio-frequency filter based on a state of the first switch,
a resonant frequency of the first parallel arm resonator and a resonant frequency of the second parallel arm resonator are different from each other,
an anti-resonant frequency of the first parallel arm resonator and an anti-resonant frequency of the second parallel arm resonator are different from each other, and
a resonant frequency of the third parallel arm resonator is greater than the resonant frequency of the first parallel arm resonator and is greater than the resonant frequency of the second parallel arm resonator.

2. The radio-frequency filter according to claim 1, wherein:

the resonant frequency of the first parallel arm resonator is less than the resonant frequency of the second parallel arm resonator, and the anti-resonant frequency of the first parallel arm resonator is less than the anti-resonant frequency of the second parallel arm resonator.

3. The radio-frequency filter according to claim 2, wherein:

the parallel arm circuit further comprises a second switch connected in series with the second parallel arm resonator, and the second parallel arm resonator and the second switch are each connected in parallel with the first parallel arm resonator and the first variable frequency circuit.

4. The radio-frequency filter according to claim 3, wherein:

the parallel arm circuit further comprises a fourth parallel arm resonator that is connected in parallel with the second switch, the fourth parallel arm resonator and the second switch constituting a second variable frequency circuit, the second variable frequency circuit is connected in series with the second parallel arm resonator, and is configured to change the frequencies of the pass band of the radio-frequency filter and the frequency of the attenuation pole based on a state of the second switch, and a resonant frequency of the fourth parallel arm resonator is greater than the resonant frequency of the first parallel arm resonator and is greater than the resonant frequency of the second parallel arm resonator.

5. A multiplexer comprising:

a common terminal;

the radio-frequency filter according to claim 4, the first input/output terminal or the second input/output terminal being connected to the common terminal; and a second filter having an input/output terminal connected to the common terminal, wherein an anti-resonant frequency of the third parallel arm resonator and an anti-resonant frequency of the fourth parallel arm resonator are both outside a pass band of the second filter.

6. The radio-frequency filter according to claim 1, wherein:

the resonant frequency of the first parallel arm resonator is greater than the resonant frequency of the second parallel arm resonator, and the anti-resonant frequency of the first parallel arm resonator is greater than the anti-resonant frequency of the second parallel arm resonator.

7. The radio-frequency filter according claim 1, wherein each of the first parallel arm resonator, the second parallel arm resonator, and the third parallel arm resonator is an acoustic wave resonator having an interdigital transducer electrode having a plurality of electrode fingers on a substrate, the substrate being at least partially piezoelectric.

8. The radio-frequency filter according to claim 7, wherein a film thickness of the plurality of electrode fingers of the third parallel arm resonator is thinner than a film thickness of the plurality of electrode fingers of the first parallel arm resonator or the second parallel arm resonator.

9. The radio-frequency filter according to claim 7, wherein:

the plurality of electrode fingers of the first parallel arm resonator or the second parallel arm resonator comprise a high-density metal layer of a high-density gold (Au), platinum (Pt), tantalum (Ta), molybdenum (Mo), or tungsten (W), and the plurality of electrode fingers of the third parallel arm resonator does not comprise a high-density metal layer or comprises a high-density metal layer thinner in film thickness than the high-density metal layer of the plurality of electrode fingers of the first parallel arm resonator or the second parallel arm resonator.

10. The radio-frequency filter according to claim 9, wherein the plurality of electrode fingers of the first parallel arm resonator or the second parallel arm resonator is of a multilayer body comprising the high-density metal layer and a low-density metal layer of a metal having a lower density than the high-density metal.

11. The radio-frequency filter according to claim 7, wherein the substrate is of lithium tantalate, lithium niobate, potassium niobate, quartz crystal, or is a multilayer body comprising two or more of lithium tantalate, lithium niobate, potassium niobate, and quartz crystal.

12. The radio-frequency filter according to claim 1, wherein the first switch is a field-effect transistor (FET) switch of gallium-arsenide (GaAs) or complementary metal oxide semiconductor (CMOS), or is a diode switch.

13. A multiplexer comprising:

a common terminal;

the radio-frequency filter according to claim 1, the first input/output terminal or the second input/output terminal of being connected to the common terminal; and a second filter having an input/output terminal connected to the common terminal, wherein an anti-resonant frequency of the third parallel arm resonator is outside a pass band of the second filter.

14. A radio-frequency front-end circuit comprising:

the radio-frequency filter according to claim 1; and a controller configured to selectively control the state of the first switch.

15. A communication device comprising:

an RF signal processing circuit configured to process a radio-frequency signal that is transmitted or received by an antenna; and the radio-frequency front-end circuit according to claim 14, the radio-frequency front-end circuit being configured to transfer the radio-frequency signal between the antenna and the RF signal processing circuit.

* * * * *

UNITED STATES PATENT AND TRADEMARK OFFICE
CERTIFICATE OF CORRECTION

| | | |
|---|---|---|
| PATENT NO. | : 10,727,810 B2 | Page 1 of 1 |
| APPLICATION NO. | : 16/553315 | |
| DATED | : July 28, 2020 | |
| INVENTOR(S) | : Koji Nosaka | |

It is certified that error appears in the above-identified patent and that said Letters Patent is hereby corrected as shown below:

In the Specification

Column 18, Line 6, " $f_{r\_off1} = \frac{\sqrt{1+\frac{C_1}{C_0}}}{2\pi\sqrt{L_1 C_1}} \ ...(9)$ " should read -- $f_{a\_off1} = \frac{\sqrt{1+\frac{C_1}{C_0}}}{2\pi\sqrt{L_1 C_1}} \ ...(9)$ --

Signed and Sealed this
Sixteenth Day of March, 2021

Drew Hirshfeld
*Performing the Functions and Duties of the*
*Under Secretary of Commerce for Intellectual Property and*
*Director of the United States Patent and Trademark Office*